(12) United States Patent
Kawagoe et al.

(10) Patent No.: US 6,388,935 B1
(45) Date of Patent: May 14, 2002

(54) SEMICONDUCTOR MEMORY THAT ENABLES DIMENSIONAL ADJUSTMENT BY USING A FUSE

(75) Inventors: Masakuni Kawagoe; Norihiko Satani; Yoshihiro Nakatake; Akihiro Narumi, all of Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 105 days.

(21) Appl. No.: 09/598,255

(22) Filed: Jun. 21, 2000

(51) Int. Cl.$^7$ .................................................. G11C 7/00
(52) U.S. Cl. .............................. 365/225.7; 365/230.06; 365/189.05
(58) Field of Search .................... 365/225.7, 230.06, 365/189.05

(56) References Cited

U.S. PATENT DOCUMENTS

| | | | |
|---|---|---|---|
| 5,367,208 A | * 11/1994 | El Gamal et al. | 326/44 |
| 5,479,113 A | * 12/1995 | Gamal et al. | 326/38 |
| 5,510,730 A | * 4/1996 | El Gamal et al. | 326/41 |
| 5,926,034 A | * 7/1999 | Seyyedy | 326/37 |
| 6,281,709 B1 | * 8/2001 | Seyyedy | 326/87 |
| 6,285,237 B1 | * 9/2001 | Sher | 327/525 |

FOREIGN PATENT DOCUMENTS

JP   8-316327   11/1996

* cited by examiner

*Primary Examiner*—Richard Elms
*Assistant Examiner*—Tuan T. Nguyen
(74) *Attorney, Agent, or Firm*—Volentine Francos, PLLC

(57) ABSTRACT

A new and improved semiconductor memory that facilitates machining of iterated circuits and solves the problems of the prior art such as the lengthy machining process, the compromised machining accuracy and the considerable time required for device evaluation is provided. A semiconductor memory 10 is provided with a plurality of output circuits 11 and a fuse circuit 12 connected to each of the output circuits. The fuse circuit outputs output signals N1 and N2 to the individual output circuits, the signal levels of which are fixed to either H level or L level depending upon whether or not fuses f1 and f2 in the fuse circuit are disconnected. The output circuits are each provided with an output buffer circuit unit 112 and a pre-driver circuit unit 111 that drives the output buffer circuit unit. The driving capability of the pre-driver circuit unit is determined by the output signal from the fuse circuit. By providing the fuses that can be easily disconnected with a laser beam, it becomes possible to adjacent the gate widths of the pre-drivers at the plurality of output circuit units all at once. As a result, the length of machining time can be reduced compared to that required in the prior art technology.

22 Claims, 20 Drawing Sheets

SEMICONDUCTOR MEMORY THAT ENABLES DIMENSIONAL ADJUSTMENT BY USING A FUSE

BACKGROUND OF THE INVENTION

The present invention relates to a semiconductor memory, and more specifically it relates to a semiconductor memory that enables dimensional adjustment by using a fuse which can be cut with a laser beam.

Circuits that constitute a semiconductor memory include circuits achieved by arraying a plurality of identically structured circuits (iterated circuits) such as an input/output circuit and a read amplifier circuit. As higher integration, further miniaturization and multiple-output structuring have been achieved in semiconductor memories in recent years, the use of iterated circuits in semiconductor memory has been on the rise.

PRIOR ART

An FIB (focused ion beam) apparatus is employed to machine an iterated circuit in the prior art. The FIB apparatus cuts wiring by taking advantage of the sputtering phenomenon that occurs when an ion beam is irradiated. For instance, the FIB apparatus is employed to adjust the width of the gate of a transistor that constitutes a pre-driver circuit for driving an output buffer circuit in the output circuit of a random access memory (RAM).

However, the number of iterated circuits in a semiconductor memory has been on the rise due to the higher integration, further miniaturization and multiple-output structuring achieved in the semiconductor memory in recent years. The increase in the number of machining areas resulting from the increase in the number of iterated circuits poses problems with respect to the machining process implemented by utilizing the FIB apparatus in the prior art in that the length of machining time is bound to increase, that the machining accuracy is compromised and that the device evaluation becomes a lengthy procedure.

SUMMARY OF THE INVENTION

An object of the present invention, which has been completed by addressing the problems of the semiconductor memory in the prior art discussed above, is to provide a new and improved semiconductor memory that facilitates machining of iterated circuits to solve the problems of the prior art such as the great length of time required for machining, the compromised machining accuracy and the lengthy device evaluation process.

Another object of the present invention is to provide a new and improved semiconductor memory that achieves a smaller layout area to minimize any increase within the chip area.

In order to achieve the objects described above, a first semiconductor memory according to the present invention is provided with a plurality of output circuits and a fuse circuit commonly connected to the output circuits. The fuse circuit outputs an output signal to each output circuit, the signal level of which is fixed to one signal level or another signal level depending upon whether or not a fuse in the circuit is disconnected, and the output circuits are each provided with an output buffer circuit unit and a pre-driver circuit unit that drives the output buffer circuit unit, with the driving capability of the pre-driver circuit unit determined by the output signal provided by the fuse circuit.

A second semiconductor memory according to the present invention is provided with a plurality of output circuits and a plurality of fuse circuits each connected to one of the output circuits. Each fuse circuit outputs an output signal to the corresponding output circuit, the signal level of which is fixed to one signal level or another signal level depending upon whether or not a fuse in the circuit is disconnected, and the output circuits are each provided with an output buffer circuit unit and a pre-driver circuit unit that drives the output buffer circuit unit, with the driving capability of the pre-driver circuit unit determined by the output signal provided by the corresponding fuse circuit.

A third semiconductor memory according to the present invention is provided with a plurality of amplifier circuits and a fuse circuit connected to the individual amplifier circuits. The fuse circuit outputs an output signal to each amplifier circuit, the signal level of which is fixed to one signal level or another signal level depending upon whether or not a fuse in the circuit is disconnected, with the amplifying capability of each amplifier circuit determined by the output signal provided by the fuse circuit.

A fourth semiconductor memory according to the present invention is provided with a plurality of amplifier circuits and a plurality of fuse circuits each connected to one of the amplifier circuits. Each fuse circuit outputs an output signal to the corresponding amplifier circuit, the signal level of which is fixed to one signal level or another signal level depending upon whether or not a fuse in the circuit is disconnected, with the amplifying capability of the amplifier circuit determined by the output signal provided by the fuse circuit.

A fifth semiconductor memory according to the present invention is provided with a plurality of delay circuits and a fuse circuit connected to the individual delay circuits. The fuse circuit outputs an output signal to each delay circuit, the signal level of which is fixed to one signal level or another signal level depending upon whether or not a fuse in the circuit is disconnected, with the delay time generated by each of the delay circuits determined by the output signal provided by the fuse circuit.

A sixth semiconductor memory according to the present invention is provided with a plurality of delay circuits and a plurality of fuse circuits each connected to one of the delay circuits. Each fuse circuit outputs an output signal to the corresponding delay circuit, the signal level of which is fixed to one signal level or another signal level depending upon whether or not a fuse in the circuit is disconnected, with the delay time generated by the delay circuit determined by the output signal provided by the fuse circuit.

A seventh semiconductor memory according to the present invention is provided with a plurality of input first-stage circuits and a fuse circuit connected to the individual input first-stage circuits. The fuse circuit outputs an output signal to each input first-stage circuit, the signal level of which is fixed to one signal level or another signal level depending upon whether or not a fuse in the circuit is disconnected, with the input voltage margin of the input first-stage circuit determined by the output signal provided by the fuse circuit.

An eighth semiconductor memory according to the present invention is provided with a plurality of input first-stage circuits and a plurality of fuse circuits each connected to one of the input first-stage circuits. Each fuse circuit outputs an output signal to the corresponding input first-stage circuit, the signal level of which is fixed to one signal level or another signal level depending upon whether or not a fuse in the circuit is disconnected, with the input voltage margin of the input first-stage circuit determined by the output signal provided by the fuse circuit.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of the preferred embodiments of the semiconductor memory according to the present invention, given in reference to the attached drawings. It is to be noted that in the specification and the drawings, the same reference numbers are assigned to components achieving functions and structural features essentially identical to one another to preclude the necessity for repeated explanation thereof. In the following explanation, a P-channel MOS transistor is referred to as a PMOS transistor, an N-channel MOS transistor is referred to as an NMOS transistor. In addition, a P-channel MOS transistor and an N-channel MOS transistor are categorically referred to simply as MOS transistors.

(First Embodiment)

Figure 1:
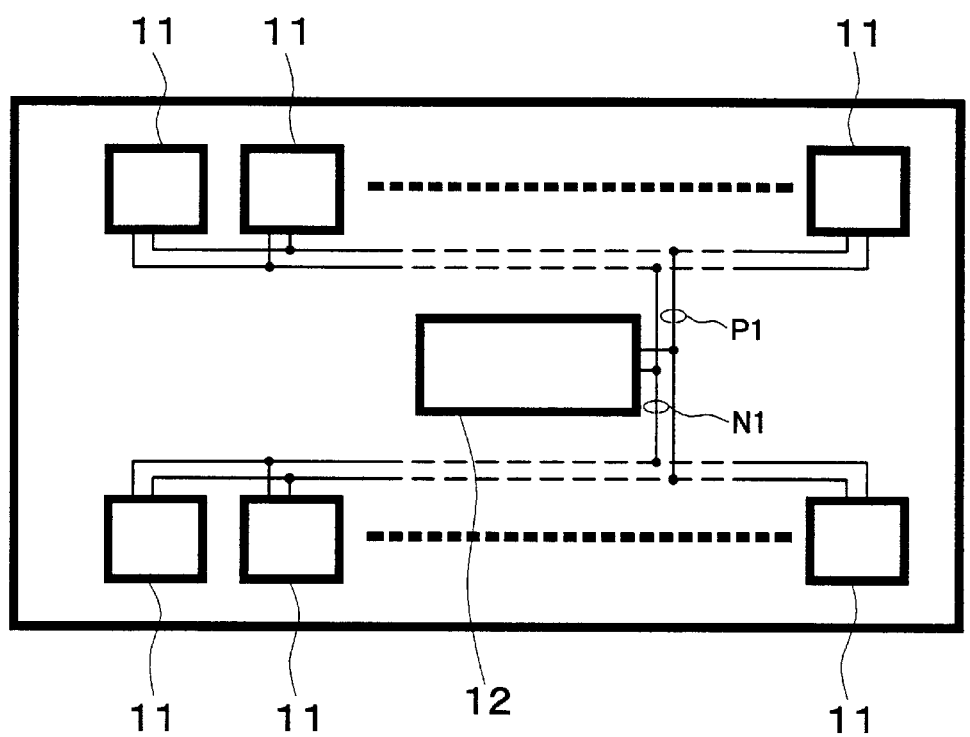
FIG. 1 illustrates the chip achieved in a first embodiment in its entirety.
Figure 2:
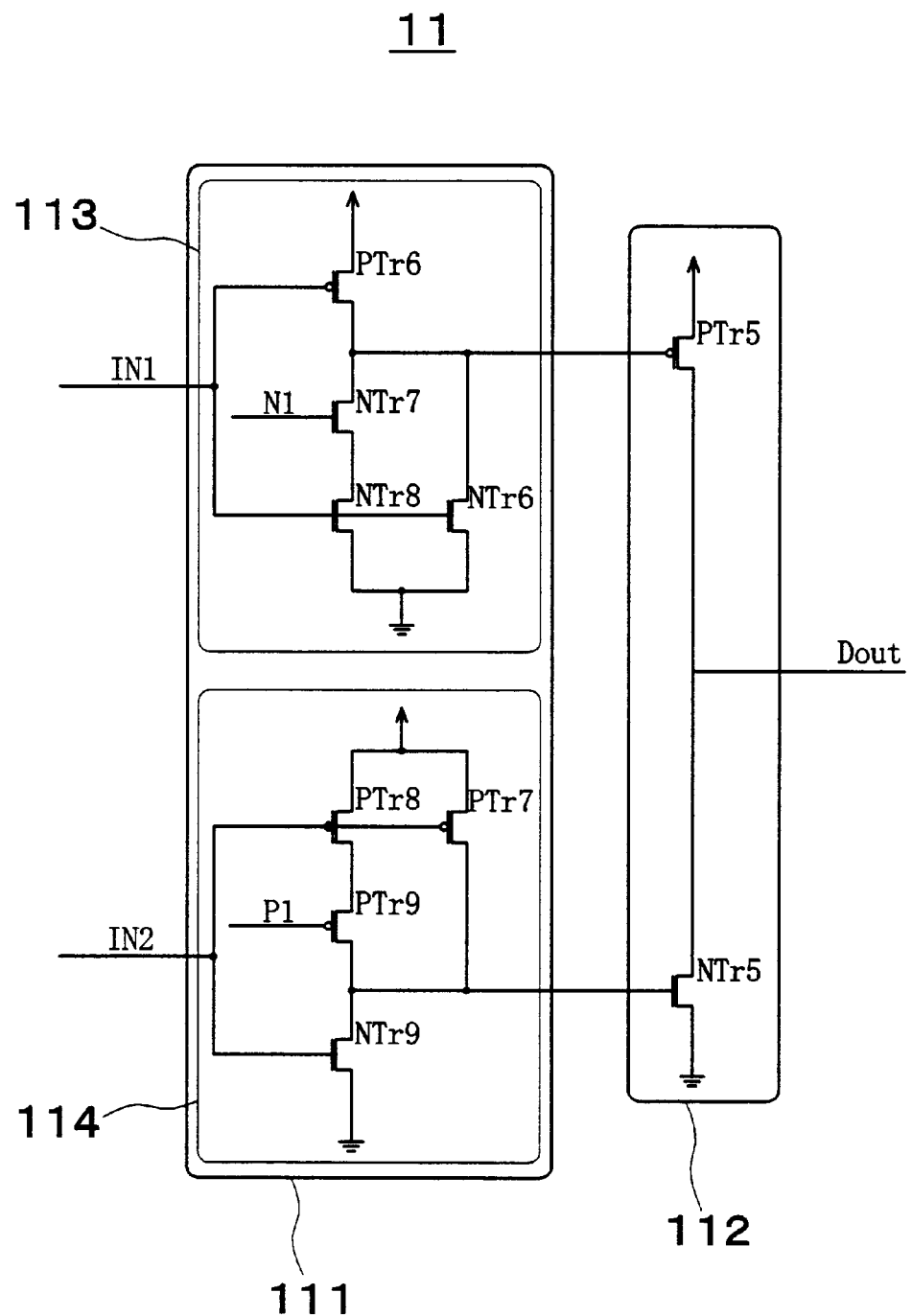
FIG. 2 illustrates an output circuit adopted in first and second embodiments.
Figure 3:
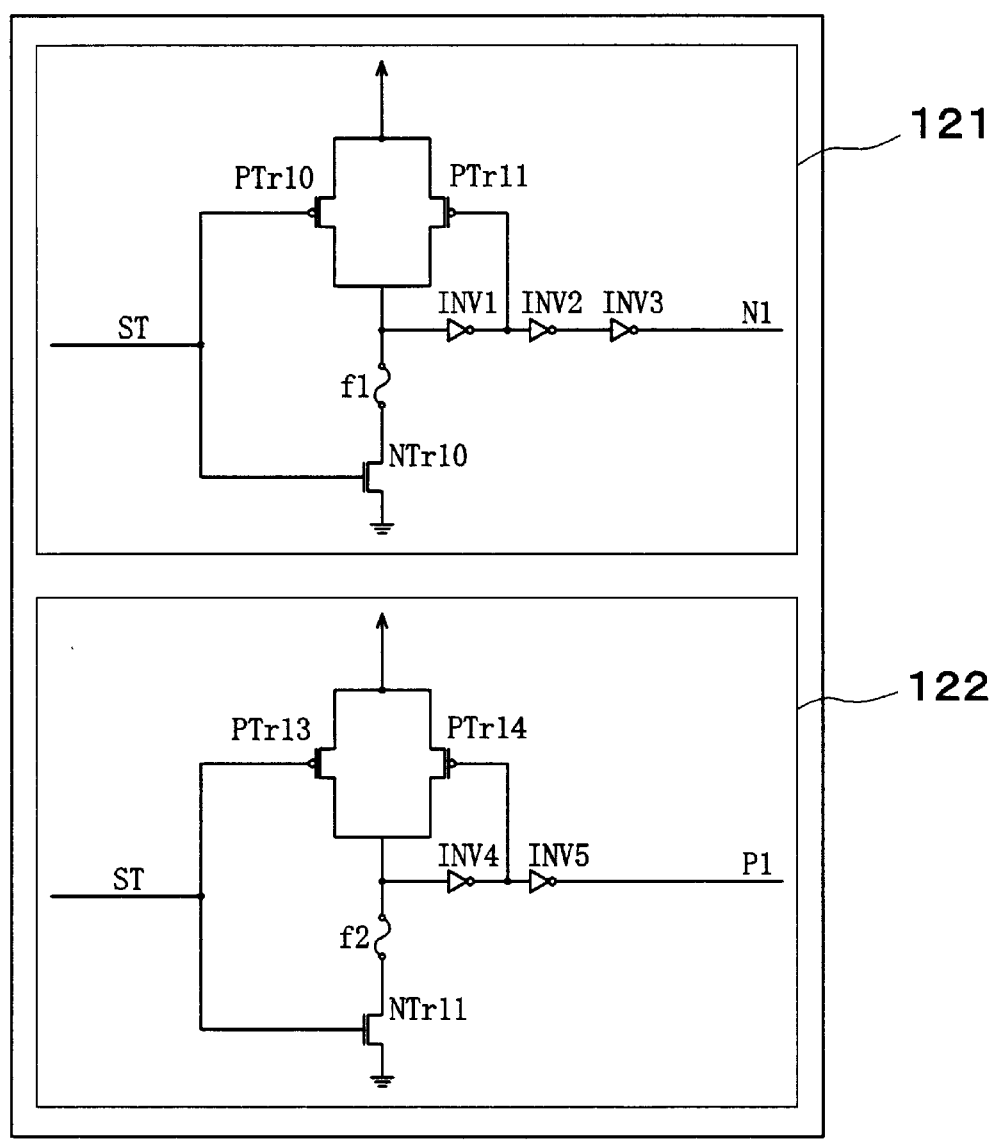
FIG. 3 illustrates a fuse circuit adopted in the first and second embodiments.

A semiconductor memory 10 in the first embodiment is explained in reference to FIGS. 1~3. The semiconductor memory 10 comprises a plurality of output circuits 11 and a fuse circuit 12 shared by the individual output circuits 11, as illustrated in FIG. 1.

As shown in FIG. 2, the output circuits 11 are each constituted of a pre-driver circuit unit 111 and an output buffer circuit unit 112. The output buffer circuit unit 112 comprises a PMOS transistor PTr5 for H level output and an NMOS transistor NTr5 for L level output. The pre-driver circuit unit 111 comprises a first pre-driver portion 113 that drives the PMOS transistor PTr5 in the output buffer circuit unit 112 at the following stage and a second pre-driver portion 114 that drives the NMOS transistor NTr5 in the output buffer circuit unit 112 at the following stage.

The first pre-driver portion 113 is constituted of a PMOS transistor PTr6, an NMOS transistor NTr7 and an NMOS transistor NTr8 that are serially connected between the source terminal and the ground terminal and an NMOS transistor NTr6 connected in parallel to the NMOS transistor NTr8. The gates of the PMOS transistor PTr6, the NMOS transistor NTr8 and the NMOS transistor NTr6 are connected to an input IN1. The gate of the NMOS transistor NTr7 is connected to an output N1 of a first fuse circuit unit 121, which is to be detailed later. The drain of the PMOS transistor PTr6 (the drain of the NMOS transistor NTr7) and the drain of the NMOS transistor NTr6 are connected to the gate of the PMOS transistor PTr5 in the output buffer circuit unit 112 at the following stage.

Thus, in the first pre-driver portion 113, the transistor that determines its driving capability is formed in a comb shape and part of the comb-shaped transistor is replaced by the MOS transistors PTr6, NTr7 and NTr8 that are serially connected.

The second pre-driver portion 114 is constituted of a PMOS transistor PTr8, a PMOS transistor PTr9 and an NMOS transistor NTr9 that are serially connected between the source terminal and the ground terminal and a PMOS transistor PTr7 connected in parallel to the PMOS transistor PTr8. The gates of the PMOS transistor PTr8, the NMOS transistor NTr9 and the PMOS transistor PTr7 are connected to an input IN2. The gate of the PMOS transistor PTr9 is connected to an output P1 of a second fuse circuit 122, which is to be detailed later. The drain of the PMOS transistor PTr9 (the drain of the NMOS transistor NTr9 and the drain of the PMOS transistor PTr7) is connected to the gate of the NMOS transistor NTr5 in the output buffer circuit unit 112 at the following stage.

Thus, in the second pre-driver portion 114, the transistor that determines its driving capability is formed in a comb shape and part of the comb-shaped transistor is replaced by the MOS transistors PTr8, PTr9 and NTr9 that are serially connected.

As shown in FIG. 3, the fuse circuit 12 comprises the first fuse circuit unit 121 that is connected to the gate of the NMOS transistor NTr7 in the first pre-driver circuit unit 113 and the second fuse circuit 122 connected to the gate of the PMOS transistor PTr9 in the second pre-driver circuit unit 114.

The first fuse circuit 121 is constituted of a PMOS transistor PTr10, a fuse f1 and an NMOS transistor NTr10 serially connected between the source terminal and the ground terminal, a PMOS transistor PTr11 connected in parallel to the PMOS transistor PTr10 and inverters INV1, INV2 and INV3 serially connected between a node located between the PMOS transistor PTr10 and the fuse f1 and the output N1. The gates of the PMOS transistor PTr10 and the NMOS transistor NTr10 are connected to an input ST. The gate of the PMOS transistor PTr11 is connected to a node located between the inverters INV1 and INV2.

The input ST is a signal whose signal level shifts from L level to H level when a specific length of time has elapsed after the power to the semiconductor memory 10 is set to ON, and it may be designed so that its level shifts when, for instance, 300 microsecond have elapsed.

The second fuse circuit 122 is constituted of a PMOS transistor PTr13, a fuse f2 and an NMOS transistor NTr11 serially connected between the source terminal and the ground terminal, a PMOS transistor PTr14 connected in parallel to the PMOS transistor PTr13 and inverters INV4 and INV5 serially connected between a node located between the PMOS transistor PTr13 and the fuse f2 and the output P1. The gates of the PMOS transistor PTr13 and the NMOS transistor NTr11 are connected to the input ST. The gate of the PMOS transistor Ptr14 is connected to a node located between the inverters INV4 and INV5.

The fuse circuit 12 described above achieves a circuit structure that enables control of the outputs P1 and N1 so that they output either H level or L level in conformance to whether or not the fuses f1 and f2 are disconnected. The following is an explanation of changes occurring in the operation in conformance to the connected/disconnected states of the fuses f1 and f2.

First, a state in which neither the fuse f1 or the fuse f2 is disconnected is explained. When the specific length of time has elapsed after a power-up, the input ST of the fuse circuit 12 shifts to H level. In the first fuse circuit 121, with the NMOS transistor NTr10 whose source is connected to the ground terminal entering an ON state, the output N1 shifts to H level via the fuse f1 and the inverters INV1, INV2 and INV3. In the second fuse circuit 122, with the NMOS transistor NTr11, whose source is connected to the ground terminal entering an ON state, an output N2 shifts to L level via the fuse f2, and the inverters INV4 and INV5.

When the output N1 is at H level and the output N2 is at L level, the NMOS transistor NTr7 in the first pre-driver circuit unit 113 becomes set to ON and the PMOS transistor PTr9 in the second output circuit unit 112 becomes set to ON at the output circuit 11. When the NMOS transistor NTr7 in the first pre-driver circuit unit 113 is in an ON state, the PMOS transistor PTr5 at the following stage is driven by the NMOS transistor NTr6, the NMOS transistor NTr7 and the NMOS transistor NTr8. When the PMOS transistor PTr9 in the second pre-driver circuit unit 114 is in an ON state, the NMOS transistor NTr5 at the following stage is driven by the PMOS transistor PTr7, the PMOS transistor PTr8 and the PMOS transistor PTr9.

Next, a state in which both the fuse f1 and the fuse f2 are disconnected is explained. Until the specific length of time elapses after a power-up, the input ST of the fuse circuit 12 remains at L level. In the first fuse circuit 121, with the PMOS transistor PTr10 whose source is connected to the source terminal entering an ON state, the output N1 shifts to L level via the inverters INV1, INV2 and INV3. At this time, the PMOS transistor PTr11, whose source is connected to the source terminal, too, is set to ON. In the second fuse circuit 122, with the PMOS transistor PTr13 whose source is connected to the source terminal entering an ON state, the output N1 shifts to H level via the fuse f2 and the inverters INV4 and INV5. At this time, the PMOS transistor PTr14, whose source is connected to the source terminal, too, is set to ON.

When the output N1 is at L level and the output N2 is at H level, the NMOS transistor NTr7 in the first pre-driver circuit unit 113 is set to OFF and the PMOS transistor PTr9 in the second pre-driver circuit unit 114 is also set to OFF at the output circuits 11. When the NMOS transistor NTr7 in the pre-driver circuit unit 113 is in an OFF state, the PMOS transistor PTr5 at the following stage is driven by the NMOS transistor NTr6 alone. When the PMOS transistor PTr9 in the second pre-driver circuit unit 114 is in an OFF state, the NMOS transistor NTr5 at the following stage is driven by the PMOS transistor PTr7 alone.

As explained above, in this embodiment, which is provided with the fuse circuit 12 having the fuse f1 and the fuse f2 that can be easily disconnected by a laser beam, the gate widths W of the pre-drivers at the plurality of output circuits can be adjusted all at once. Thus, the length of time required for the machining process can be reduced compared to that required in the prior art technology, in which the wiring is disconnected by employing an FIB apparatus.

(Second Embodiment)

Figure 4:
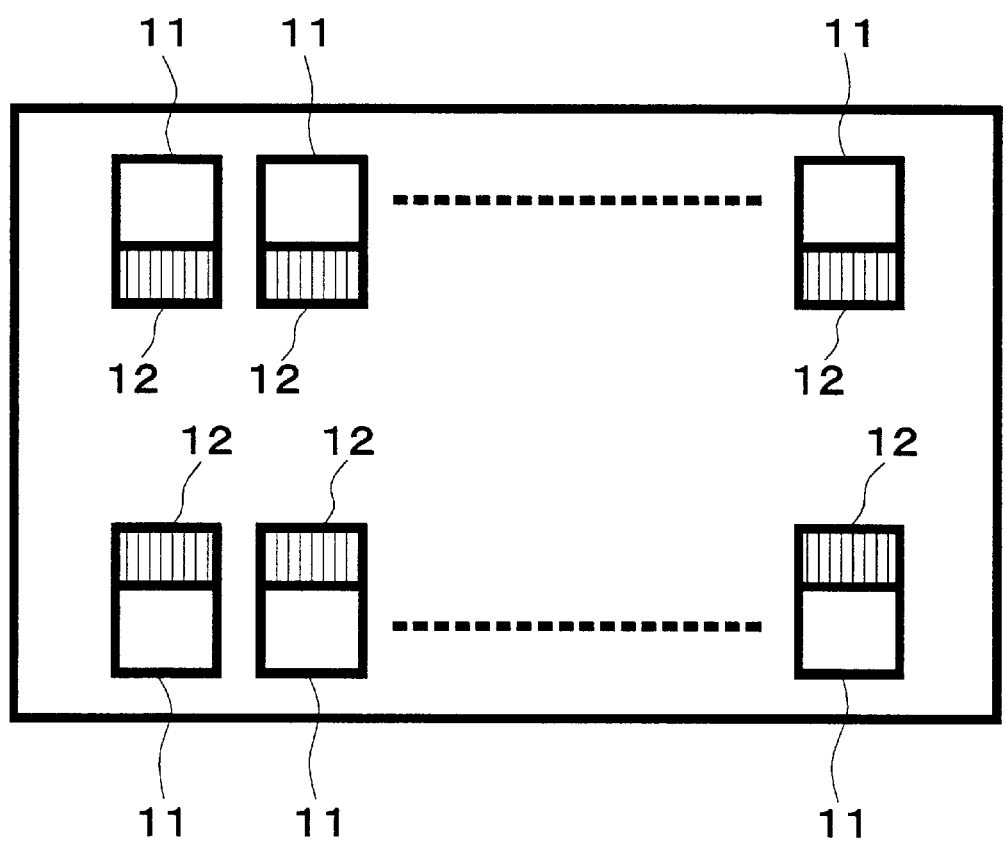
FIG. 4 illustrates the chip achieved in the second embodiment in its entirety.

A semiconductor memory 20 in the second embodiment is explained in reference to FIG. 4. As shown in FIG. 4, the semiconductor memory 20 comprises a plurality of output circuits 11 and fuse circuits 12 each provided in correspondence to one of the output circuits 11. It is to be noted that since the structural features and the operations achieved in the output circuits 11 and the fuse circuit 12 are identical to those achieved in the first embodiment, their explanation is omitted.

As described above, in the embodiment in which the fuse circuit 12 are provided each in correspondence to one of the output circuits 11, the gate width W can be adjusted at each output circuit 11.

(Third Embodiment)

Figure 5:
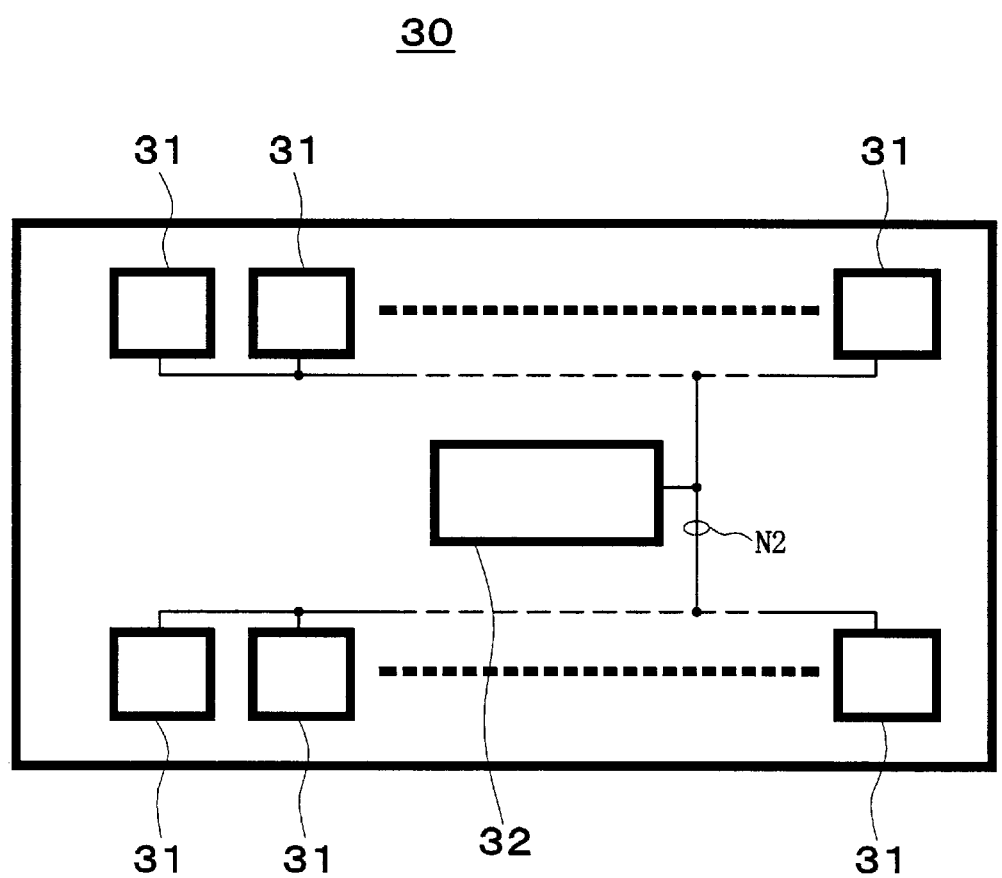
FIG. 5 illustrates the chip achieved in a third embodiment in its entirety.
Figure 6:
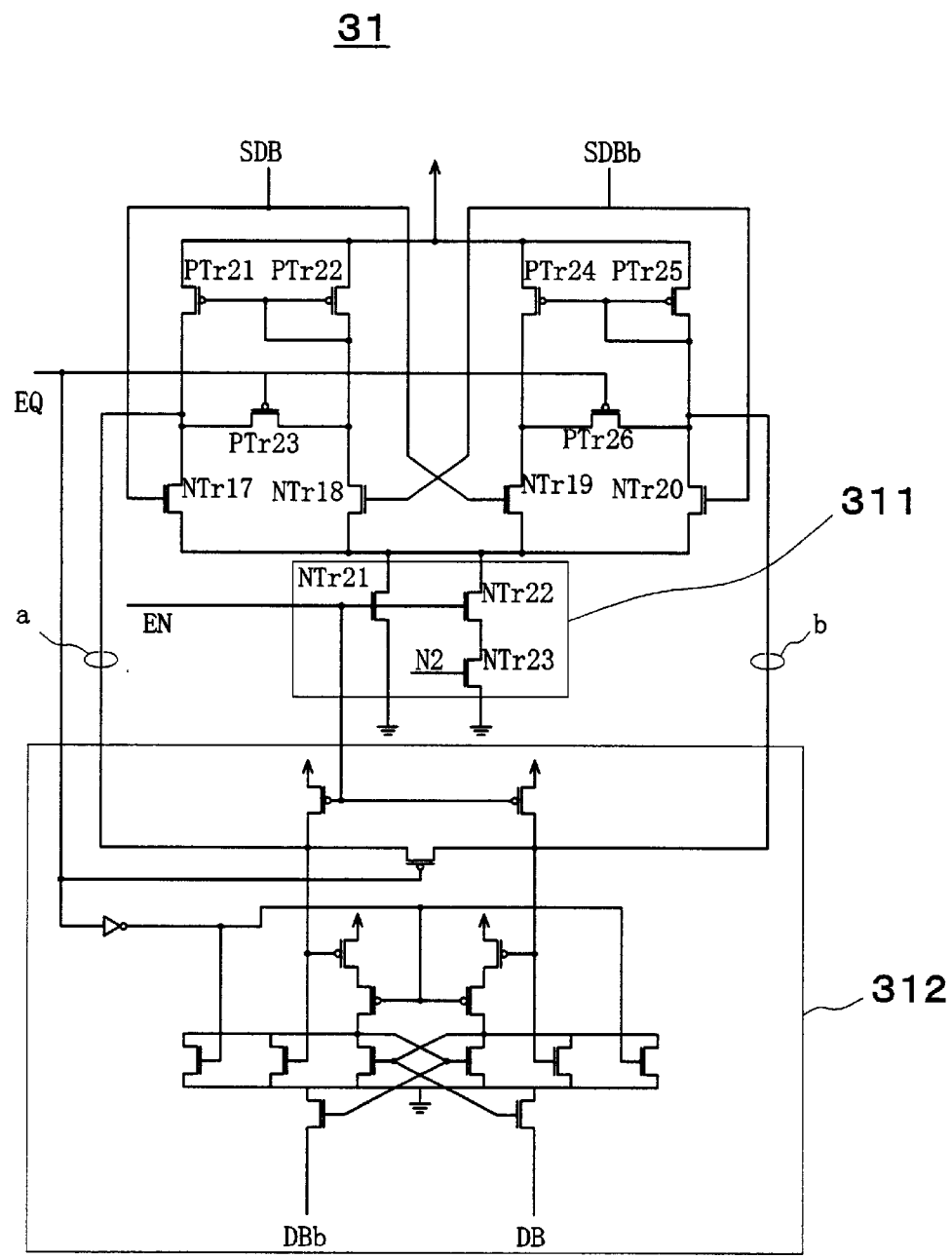
FIG. 6 illustrates an amplifier circuit adopted in third and fourth embodiments.
Figure 7:
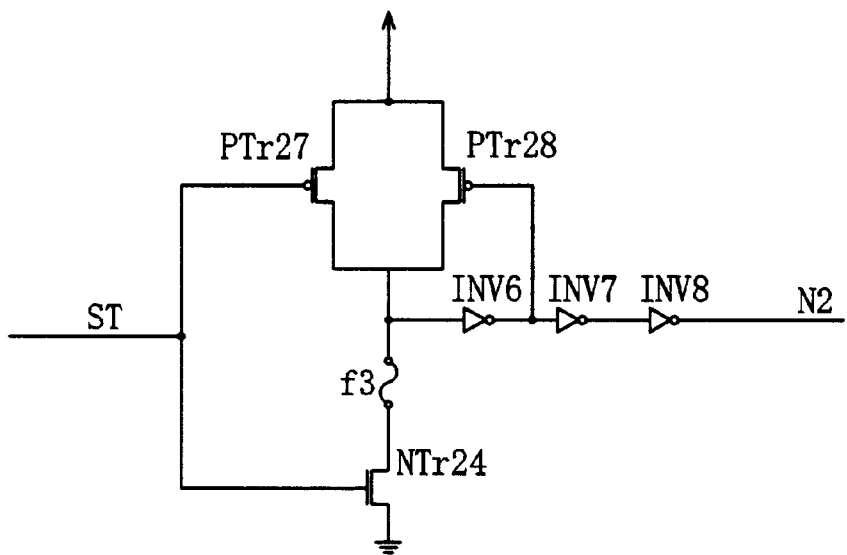
FIG. 7 illustrates a fuse circuit adopted in the third and fourth embodiments.

A semiconductor memory 30 in the third embodiment is now explained in reference to FIGS. 5–7. As shown in FIG. 5, the semiconductor memory 30 comprises a plurality of amplifier circuit 31 and a fuse circuit 32 shared by the individual amplifier circuits 31.

The amplifier circuit 31 are each constituted of a PMOS transistor PTr21 and an NMOS transistor NTrl7 serially connected between the source terminal and an NMOS transistor unit 311, a PMOS transistor PTr22 and an NMOS transistor NTrl8 serially connected between the source terminal and the NMOS transistor unit 311, a PMOS transistor PTr24 and an NMOS transistor NTrl9 serially connected between the source terminal and the NMOS transistor unit 311, a PMOS transistor PTr25 and an NMOS transistor NTr20 serially connected between the source terminal and the NMOS transistor unit 311, a PMOS transistor PTr23 connected between the drain (a node "a") of the PMOS transistor PTr21 and the drain of the PMOS transistor PTr22, a PMOS transistor which PTr26 connected between the PMOS transistor PTr24 and the drain (a node "b") of the PMOS transistor PTr25 and a DB/DBb amplifier circuit 312 connected to the node "a" and the node "b".

A signal SDB is input to the gates of the NMOS transistors NTr17 and NTr19. A signal SDBb is input to the gates of the NMOS transistors NTr18 and NTr20. It is to be noted that the signals SDB and SDBb are complementary to each other.

An amplifier equalize signal EQ is input to the gates of the PMOS transistors PTr23 and PTr26 and the DB/DBb amplifier circuit 312.

In addition, an amplifier enable signal EN is input to the gates of the NMOS transistors NTr21 and NTr22 and the DB/DBb amplifier circuit 312.

In each amplifier circuit 31, its amplification speed is determined by the NMOS transistor unit 311 constituted of the NMOS transistors NTr21, NTr22 and NTr23. Thus, the structure of the amplifier circuit 31 is achieved by forming the transistor that determines the amplifying capability in a comb shape and replacing part of the comb-shaped transistor with the MOS transistors NTr22 and NTr23 that are serially connected.

As illustrated in FIG. 6, the fuse circuit 32 is constituted of a PMOS transistor PTr27, a fuse f3 and an NMOS transistor NTr24 serially connected between the source terminal and the ground terminal, a PMOS transistor PTr28 connected in parallel to the PMOS transistor PTr27 and inverters INV6, INV7 and INV8 serially connected between a node located between the PMOS transistor PTr27 and the fuse f3 and an output N2. The gates of the PMOS transistor PTr27 and the NMOS transistor NTr27 are connected to an input ST. The input ST is a signal similar to that generated in the first embodiment. The gate of the PMOS transistor PTr28 is connected to a node located between the inverters INV6 and INV7.

The fuse circuit 32 described above achieves a circuit structure that enables control of the output N2 so that it outputs either H level or L level in conformance to whether or not the fuse f3 is disconnected. The following is an explanation of changes occurring in the operation in conformance to the connected/disconnected state of the fuse f3.

First, a state in which the fuse f3 is not disconnected is explained.

When a specific length of time has elapsed after a power-up, the input ST of the fuse circuit 32 shifts to H level. In the fuse circuit 32, with the NMOS transistor NTr24, whose source is connected to the ground terminal entering an ON state, the output N2 shifts to H level via the fuse f3 and the inverters INV6, INV7 and INV8. When the output N2 is at H level, the NMOS transistor NTr23 is in an ON state at the amplifier circuit 31. Thus, the capability of the NMOS transistor unit 311 which determines the amplification speed of the amplifier circuit 31 corresponds to the total of the capabilities of the NMOS transistors NTr21, NTr22 and NTr23.

Next, a state in which the fuse f3 is not disconnected is explained.

Until the specific length of time elapses after a power-up, the input ST at the fuse circuit 32 remains at the L level. In the fuse circuit 32, with the PMOS transistor PTr27 whose source is connected to the source terminal entering an ON state, the output N2 shifts to L level via the inverters INV6, INV7 and INV8. At this time, the PMOS transistor PTr28 whose source is connected to the source terminal, too, is set to ON. When the output N2 is at L level, the NMOS transistor NTr23 is in an OFF state at the amplifier circuits 31. Thus, the capability of the NMOS transistor unit 311 that determines the amplification speed of the amplifier circuit 31 corresponds to the. capability of the PMOS transistor PTr21 alone.

As explained above, in this embodiment, by providing the fuse circuit 32 having the fuse f3 that can be easily disconnected with a laser beam, the gate widths W of the NMOS transistor units that determine the amplification speeds of the amplifier circuits 31 within the chip can be changed all at once. Thus, the length of time required for machining can be reduced compared to that required in the prior art technology, in which wiring is disconnected by employing an FIB apparatus.

(Fourth Embodiment)

Figure 8:
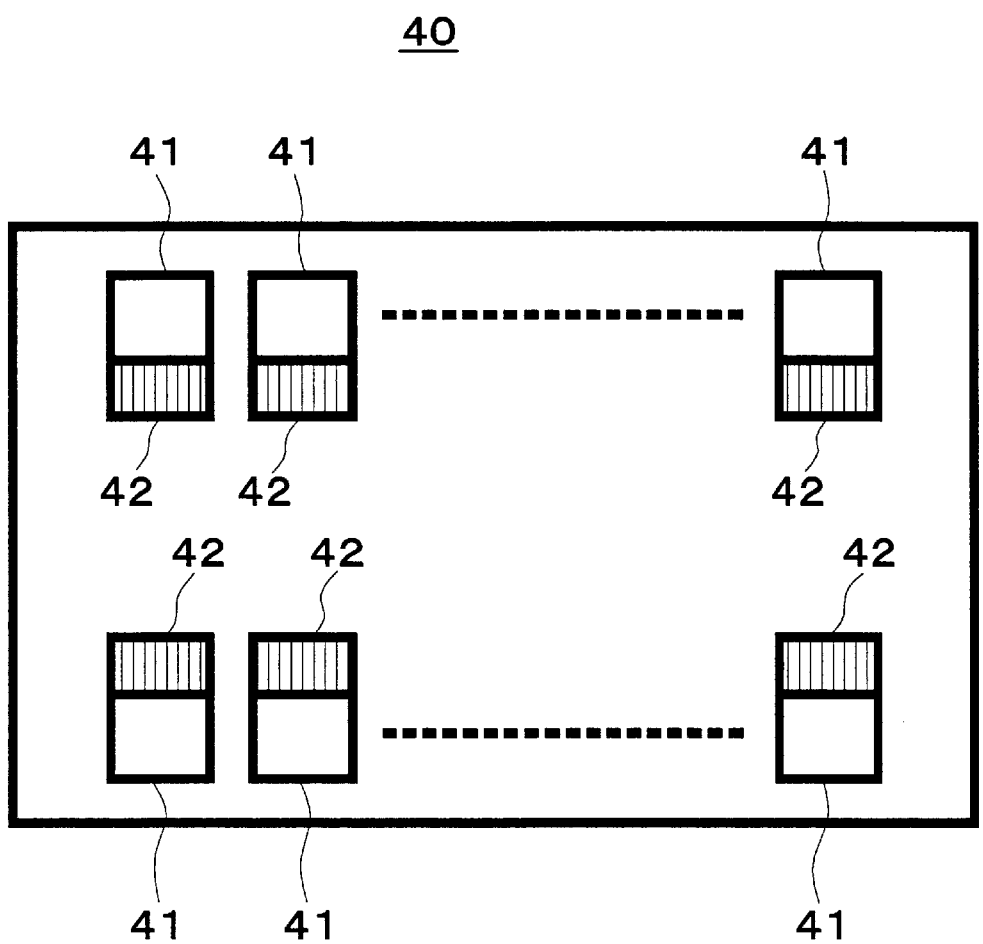
FIG. 8 illustrates the chip achieved in the fourth embodiment in its entirety.

A semiconductor memory 40 in the fourth embodiment is explained in reference to FIG. 8. As illustrated in FIG. 8, the semiconductor memory 40 comprises a plurality of amplifier circuit 31 and fuse circuits 32 each provided in correspondence to one of the amplifier circuits 31. It is to be noted that since the structural features and operations achieved in the amplifier circuit 31 and the fuse circuit 32 are identical to those achieved in the third embodiment described earlier, their explanation is omitted.

As explained above, in this embodiment, by providing the fuse circuit 32 each in correspondence to one of the amplifier circuits 31, the adjustment of the NMOS transistor unit that determines the amplification speed of each amplifier circuit 31 can be implemented at each amplifier circuit 31.

(Fifth Embodiment)

Figure 9:
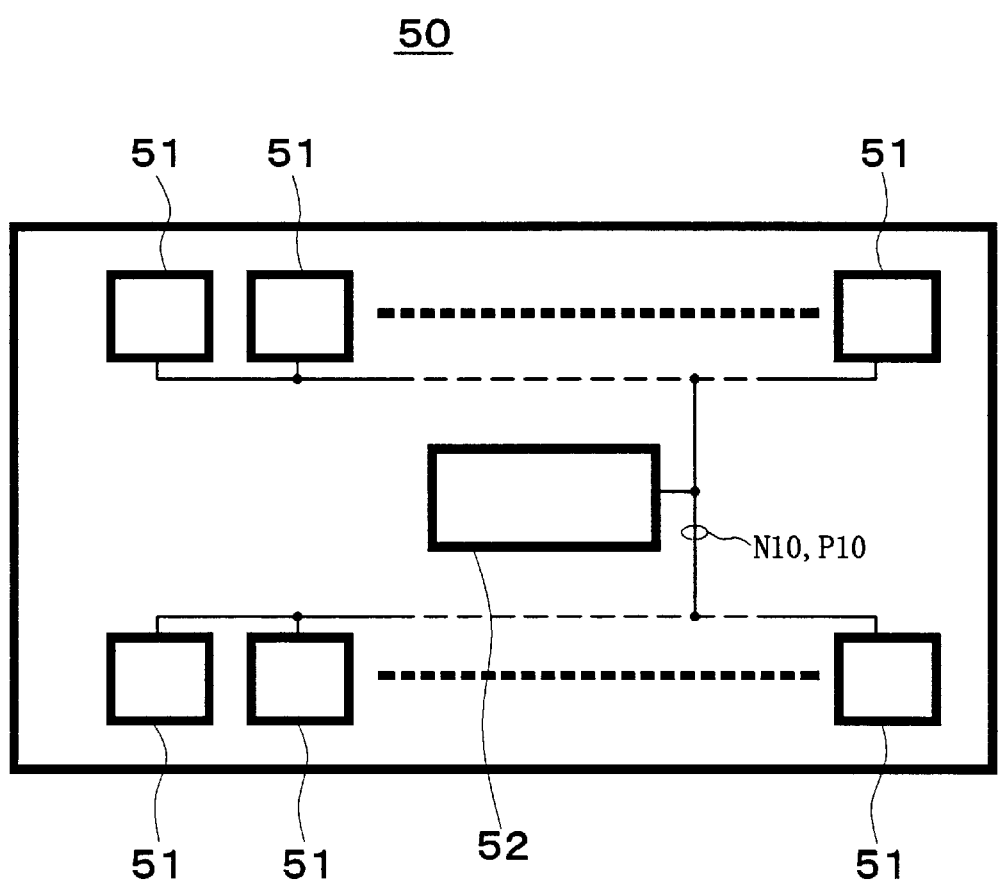
FIG. 9 illustrates the chip achieved in a fifth embodiment in its entirety.
Figure 10:
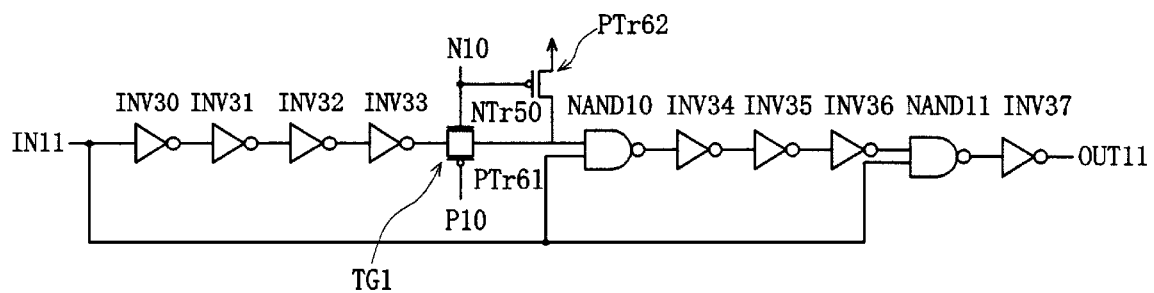
FIG. 10 illustrate a delay circuit adopted in fifth and sixth embodiments.
Figure 11:
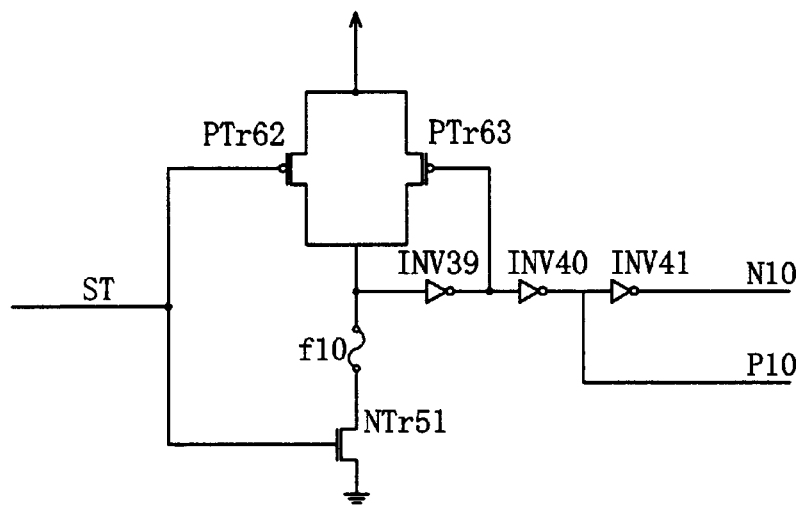
FIG. 11 illustrates a fuse circuit adopted in the fifth and sixth embodiments.

A semiconductor memory 50 in the fifth embodiment is now explained in reference to FIGS. 9~11. As illustrated in FIG. 9, the semiconductor memory 50 comprises a plurality of delay circuits 51 and a fuse circuit 52 shared by the individual delay circuits 51.

As illustrated in FIG. 10, the delay circuits 51 are each constituted of inverters INV30, INV31, INV32 and IMV33 serially connected between an input IN11 and an output OUT11, a transfer gate TG1 comprising an NMOS transistor NTr50 and a PMOS transistor PTr61, a NAND circuit NAND 10, inverters INV34, INV35 and INV36, a NAND circuit NAND 11, an inverter INV37 and a PMOS transistor PTr62 with the gate thereof connected to the gate of the NMOS transistor Ntr50, the source thereof connected to the source terminal and the drain thereof connected to the drain of the NMOS transistor NTr50. Other terminals at the NAND circuit NAND 10 and the NAND circuit NAND 11 are connected to the input IN11.

As described above, the transfer gate TG1 is provided in the inverter chain constituted of the inverters INV30~INV33 that are connected serially and the inverters INV34~INV36, and functions as a switch that adjusts the length of the inverter chain.

As illustrated in FIG. 11, the fuse circuit 52 comprises a PMOS PTr62, a fuse f10 and an NMOS transistor NTr51 that are connected serially between the source terminal and the ground terminal, a PMOS transistor PTr63 connected in parallel to the PMOS transistor PTr62 and inverters INV39, INV40 and INV41 serially connected between a node located between the PMOS transistor PTr62 and the fuse f10 and an output N10. The output of the inverter INV40 is connected to another output P10. The gates of the PMOS transistor PTr62 and the NMOS transistor NTr51 are connected to an input ST. The input ST is a signal identical to that generated in the first embodiment. The gate of the PMOS transistor PTr63 is connected to a node located between the inverters INV39 and INV40.

The fuse circuit 52 described above achieves a circuit structure that enables control of the outputs N10 and P10 so that they output H level or L level depending upon whether or not the fuse f10 is disconnected. The following is an explanation of changes occurring in the operation in conformance to the connected/disconnected state of the fuse f10.

First, a state in which the fuse f10 is not disconnected is explained.

When a specific length of time has elapsed after a power-up, the input ST of the fuse circuit 52 shifts to H level. In the fuse circuit 52, with the NMOS transistor NTr51, whose source is connected to the ground terminal entering an ON state, the output P10 shifts to L level via the fuse f10 and the inverters INV39 and INV40, and the output N10 shifts to H level via the inverter INV41. When the output P10 is at L level and the output N10 is at H level, the transfer gate TG1 in the delay circuit 51 remains in an ON state at all times. Thus, the delay capability of the delay circuit 51 corresponds to the sum of the delay capabilities of the inverters INV30, INV31, INV32 and INV33.

Next, a state in which the fuse f10 is disconnected is explained.

The input ST is at L level after a power-up, and the PMOS transistor PTr62 whose source is connected to the source terminal becomes set to ON. When the PMOS transistor PTr62 enters an ON state, the PMOS transistor PTr63 whose source is connected to the source terminal is set to ON via the inverter INV39. As a result, the output P10 shifts to H level via the inverters INV39 and INV40, and the output N10 shifts to L level via the inverter INV41. Next, after the specific length of time has elapsed, the input ST shifts to H level to set the NMOS transistor Ntr51 to ON. However, since the fuse f10 is disconnected, the outputs N10 and P10 remain unaffected. When the output P10 is at H level and the output N10 shifts to L level, the transfer gate TG1 in the delay circuit 51 remains in an OFF state at all times. Thus, the absence of delay at the inverters INV30, INV31, INV32 and INV33 results in a reduction in the delay time at the delay circuit 51.

As explained above, in the embodiment, by providing the fuse circuit 52 having the fuse f10 that can be easily disconnected with a laser beam, the lengths of inverter delays that determine that delay at the delay circuits can be changed all at once. As a result, a reduction in the machining time compared to that required in the prior art technology, which employs an FIB apparatus to disconnect wiring, is achieved.

(Sixth Embodiment)

Figure 12:
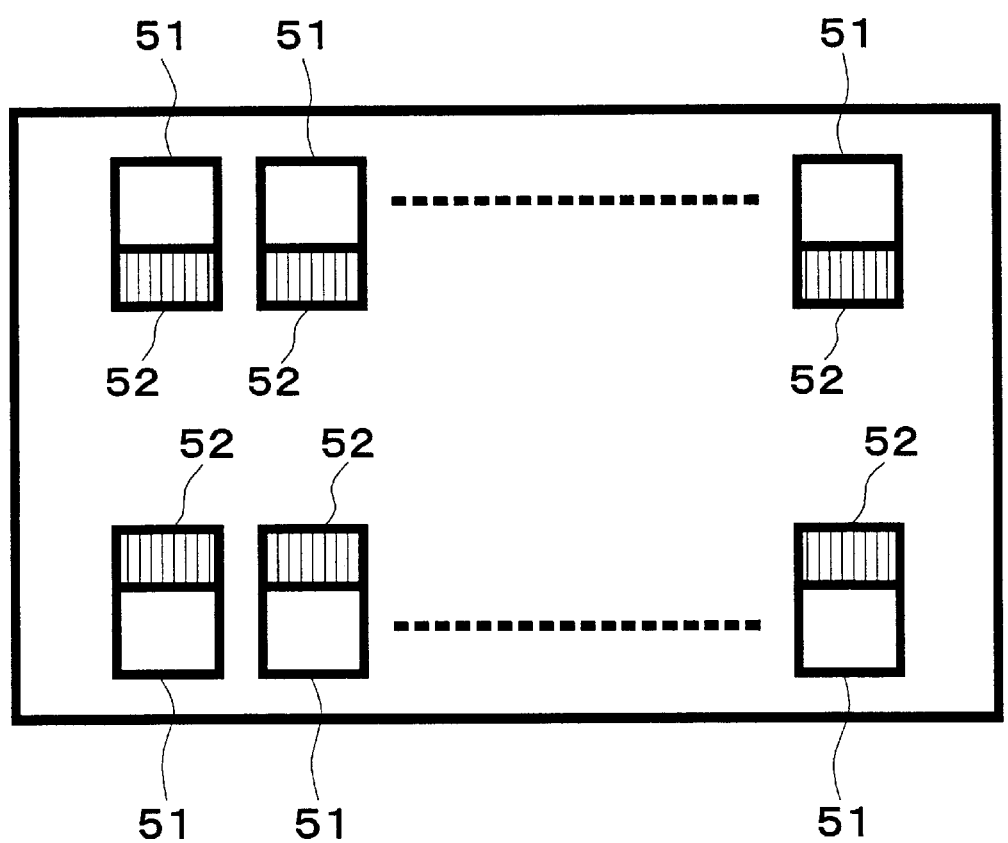
FIG. 12 illustrates the chip achieved in the sixth embodiment in its entirety.

A semiconductor memory 60 in the sixth embodiment is explained in reference to FIG. 12. As illustrated in FIG. 12, the semiconductor memory 60 comprises a plurality of delay circuits 51 and fuse circuits 52 each provided in correspondence to one of the delay circuits 51. It is to be noted that since the structural features and operations in the delay circuits 51 and the fuse circuit 52 are identical to those achieved in the fifth embodiment, their explanation is omitted.

As described above, in this embodiment, by providing the fuse circuit 52 each in correspondence to one of the delay circuits 51, the delay capability can be adjusted at each delay circuit 51.

(Seventh Embodiment)

Figure 13:
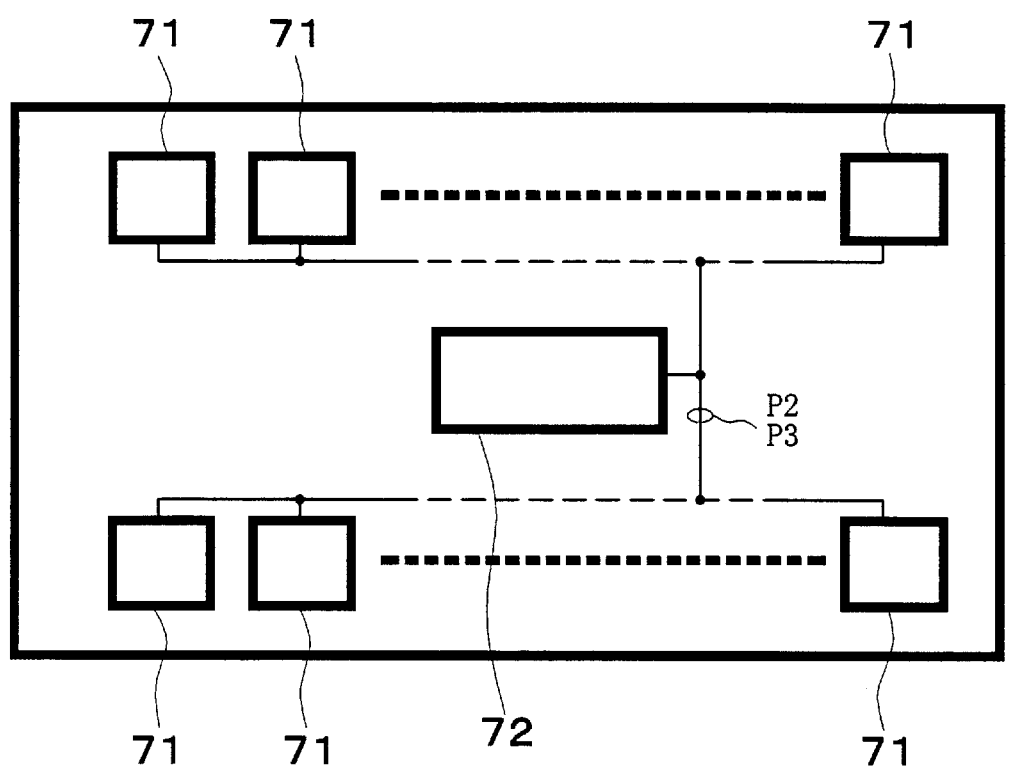
FIG. 13 illustrates the chip achieved in a seventh embodiment in its entirety.
Figure 14:
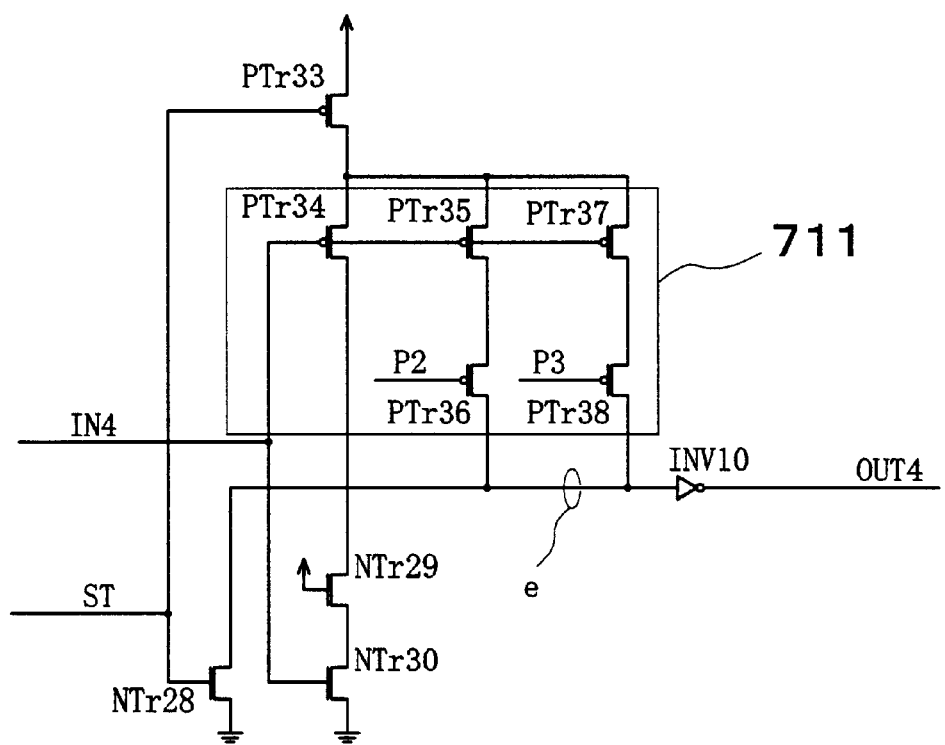
FIG. 14 illustrates an input first-stage circuit adopted in a seventh embodiment.
Figure 15:
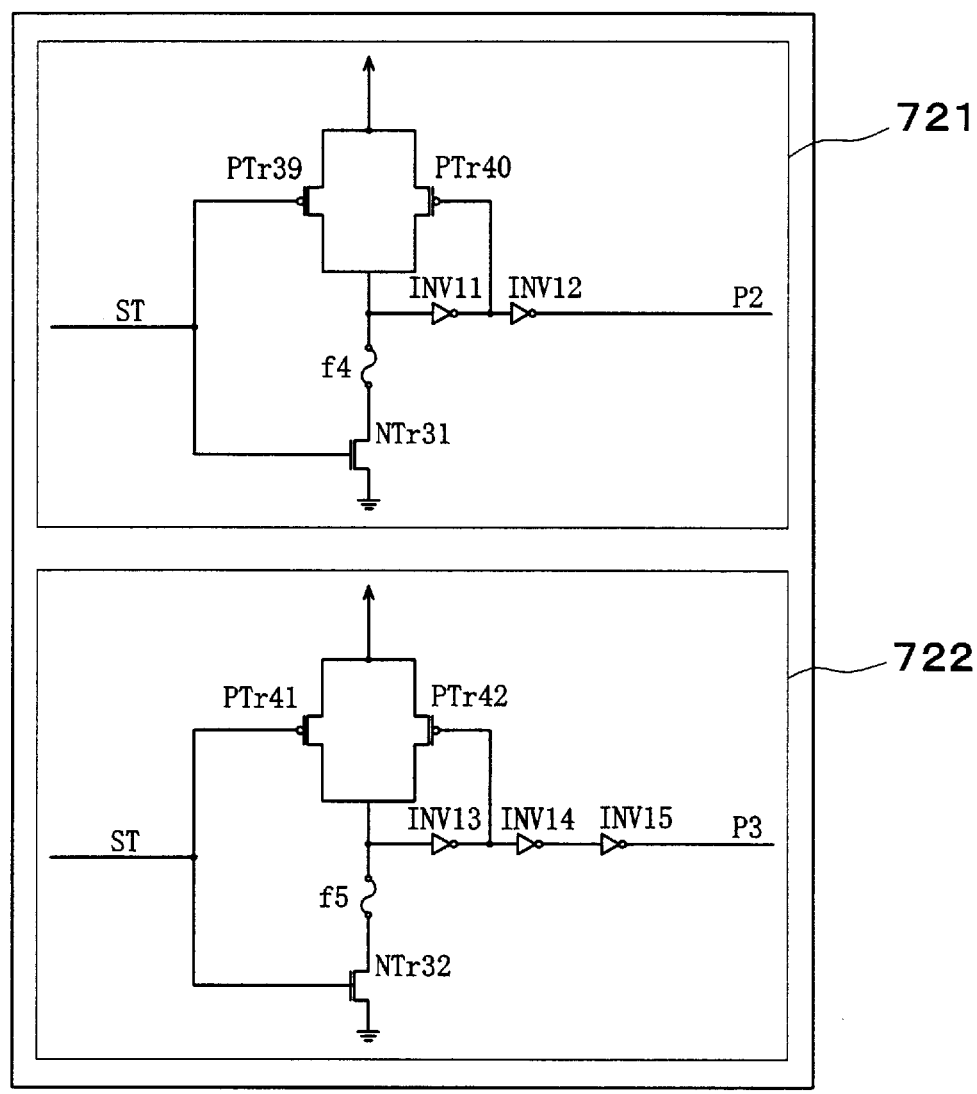
FIG. 15 illustrates a fuse circuit adopted in the seventh embodiment.

A semiconductor memory 70 in the seventh embodiment is explained in reference to FIGS. 13–15. The semiconductor memory 70 comprises a plurality of input first-stage circuits 71 and a fuse circuit 72 shared by the individual input first-stage 71, as illustrated in FIG. 13.

As illustrated in FIG. 14, the input first-stage circuits 71 are each constituted of a PMOS transistor PTr33, a PMOS transistor PTr34, an NMOS transistor NTr29 and an NMOS transistor NTr30 serially connected between the source terminal and the ground terminal, a PMOS transistor PTr35 and a PMOS transistor PTr36 connected in parallel to the PMOS transistor PTr34, a PMOS transistor PTr37 and a PMOS transistor PTr38 connected in parallel to the PMOS transistor PTr34 and an NMOS transistor NTr28 and an inverter INV10 serially connected between an input ST and an output OUT4.

An input IN4 is connected to the individual gates of the PMOS transistor PTr34, the PMOS transistor PTr35, the PMOS transistor PTr37 and the NMOS transistor NTr30. The input ST is connected to the individual gates of the PMOS transistor PTr33 and the NMOS transistor NTr28. The gate of the NMOS transistor NTr29 is connected to the source terminal. The gate of the PMOS transistor PTr36 is connected to an output P2 of a first fuse circuit unit 722 which is to be detailed later. The gate of the PMOS transistor PTr38 is connected to an output P3 of a second fuse circuit unit 722 which is to be detailed later.

At each input first-stage circuit 71, the speed at which a node "e" connected to the output OUT4 via the inverter INV10 shifts to H level is determined by a PMOS transistor unit 711 constituted of the PMOS transistors PTr34, PTr35, PTr36, PTr37 and PTr38. As described above, the input first-stage circuit 71 achieves a structure in which the transistor that determines the input voltage margin is formed in a comb shape and part of the comb-shaped transistor is replaced by the MOS transistors PTr35 and PTr 36 that are serially connected or the MOS transistors PTr37 and PTr38 that are serially connected.

The fuse circuit 72 comprises the first fuse circuit 721 connected to the gate of the PMOS transistor PTr38 and the second fuse circuit 722 connected to the gate of the PMOS transistor PTr37, as shown in FIG. 15.

The first fuse circuit 721 is constituted of a PMOS transistor PTr39, a fuse f4 and an NMOS transistor NTr31 serially connected between the source terminal and the ground terminal, a PMOS transistor PTr40 connected in parallel to the PMOS transistor PTr39 and inverters INV11 and INV12 serially connected between a node located between the PMOS transistor PTr39 and the f4 and an output P2. The gates of the PMOS transistor PTr39 and the NMOS transistor NTr31 are connected to an input ST. The gate of the PMOS transistor PTr40 is connected to a node located between the inverters INV11 and INV12. The input ST is a signal identical to that generated in the first embodiment.

The second fuse circuit 722 is constituted of a PMOS transistor PTr41, a fuse f5 and an NMOS transistor NTr32 serially connected between the source terminal and the ground terminal, a PMOS transistor PTr42 connected in parallel to the PMOS transistor PTr41 and inverters INV13, INV14 and INV15 serially connected between a node located between the PMOS transistor PTr41 and the fuse f5 and an output P3. The gates of the PMOS transistor PTr41 and the NMOS transistor NTr32 are connected to the input ST. The gate of the PMOS transistor PTr42 is connected to a node located between the inverters INV13 and INV14.

The fuse circuit 72 described above achieves a circuit structure that enables control of the outputs P2 and P3 so that they output either H level or L level in conformance to whether or not the fuses f4 and f5 are disconnected. The following is an explanation of changes occurring in the operation in conformance to the connected/disconnected states of the fuses f4 and f5.

First, a state in which neither the f4 or the fuse f5 is disconnected is explained. When the specific length of time has elapsed after a power-up, the input ST of the fuse circuit 72 shifts to H level. In the first fuse circuit 721, with the NMOS transistor NTr31, whose source is connected to the ground terminal entering an ON state, the output P2 shifts to L level via the f4 and the inverters INV11 and INV12. In the second fuse circuit 722, with the NMOS transistor NTr32, whose source is connected to the ground terminal entering an ON state, the output P3 shifts to H level via the fuse f5 and the inverters INV13, INV14 and INV15. When the output P2 is at L level and the output P3 is at H level, the PMOS transistor PTr36 becomes set to ON and the PMOS transistor PTr38 is set to OFF at the input first-stage circuit 71. In this case, the capable of the PMOS transistor unit 711 that determines the speed at which the node "e" shifts to H level corresponds to the total of the capability of the PMOS transistor PTr34 and the capability of the PMOS transistor PTr35.

Next, a state in which the fuse f4 is disconnected but the fuse f5 is not disconnected is explained. Until the specific length of time elapses after a power-up, the input ST at the fuse circuit 72 remains at L level. In the first fuse circuit 721, with the PMOS transistor PTr39 whose source is connected to the source terminal entering an ON state, the output P2 shifts to H level via the inverters INV11 and INV12. At this time, the PMOS transistor PTr40, which is connected to the source terminal, also enters an ON state. In the second fuse circuit 722, the output P3 shifts to H level as described above. When the output P2 is at H level and the output P3 is at H level, the PMOS transistor PTr36 becomes set to OFF and the PMOS transistor PTr38 also becomes set to OFF at the input first-stage circuit 71. In this case, the capability of the PMOS transistor unit 711 that determines the speed with which the node "e" shifts to H level corresponds to the capability of the PMOS transistor PTr34 alone.

Next, a state in which the f4 is not disconnected but the fuse f5 is disconnected is explained. As described earlier, the output P2 shifts to L level in the first fuse circuit 721. In addition, until the specific length of time elapses after a power-up, the input ST of the fuse circuit 72 remains at L level. In the second fuse circuit, with the PMOS transistor PTr41 connected to the source terminal entering an ON state, the output P4 shifts to L level via the inverters INV13, INV14 and INV15. At this time, the PMOS transistor PTr42, which is connected to the source terminal, too, becomes set to ON. When the output P2 is at L level and the output P3 is at L level, the PMOS transistor PTr36 becomes set to ON and the PMOS transistor PTr38 also becomes set to ON at the input first-stage circuit 71. In this case, the capability of the PMOS transistor unit 711 that determines the speed at which the node "e" shifts to H level corresponds to the total of the capabilities of the PMOS transistor Ptr34, the PMOS transistor PTr35 and the PMOS transistor PTr37.

As explained above, in this embodiment, by providing the fuse circuit 72 having the fuse f4 and the fuse f5, which can be easily disconnected by a laser beam, the gate widths W that determine the input voltage margins at the input first-stage circuits can be adjusted all at once. Thus, the length of machining time can be reduced compared to that required in the prior art technology that employs an FIB apparatus to disconnect wiring.

(Eighth Embodiment)

Figure 16:
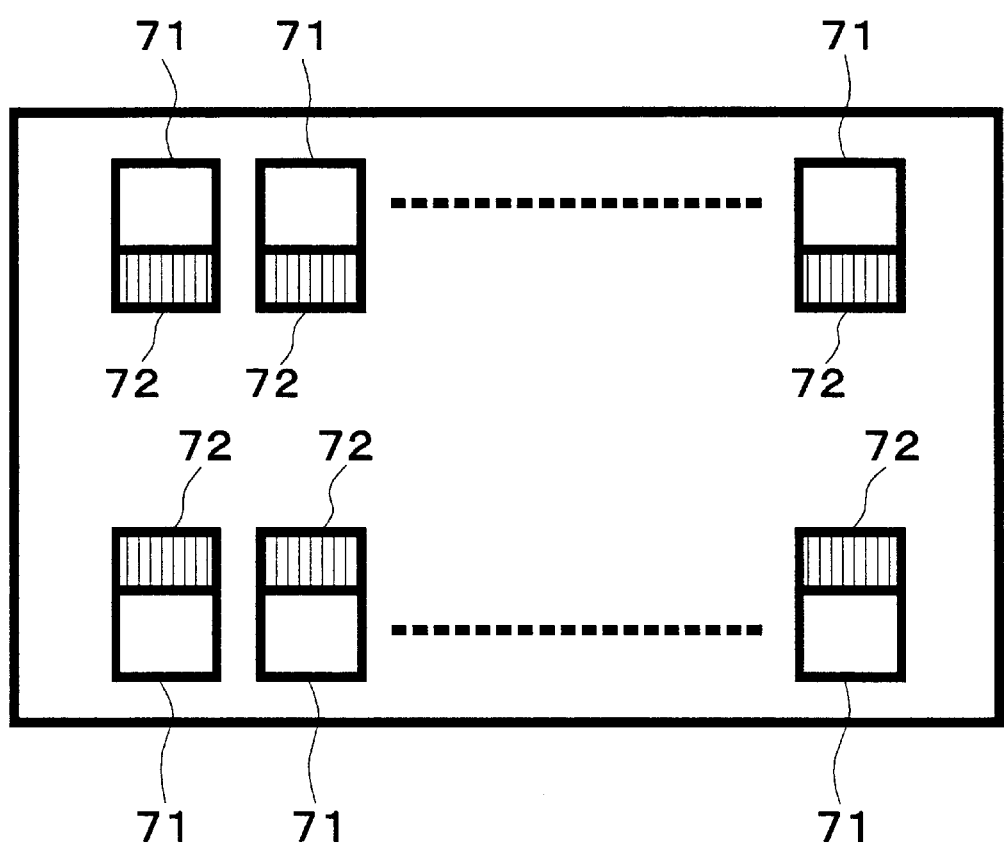
FIG. 16 illustrates the chip achieved in the eighth embodiment in its entirety.

A semiconductor memory 80 in the eighth embodiment is explained in reference to FIG. 16. As shown in FIG. 16, the semiconductor memory 80 comprises a plurality of input first-stage 71 and fuse circuits 72 each provided in correspondence to one of the input first-stage 71. It is to be noted that since the structural features and the operations achieved in the input first-stage 71 and the fuse circuit 72 are identical to those achieved in the seventh embodiment, their explanation is omitted.

As described above, in the embodiment in which the fuse circuit 72 are provided each in correspondence to one of the input first-stage 71, the gate width W can be adjusted at each input first-stage 71.

(ninth Embodiment)

Figure 17:
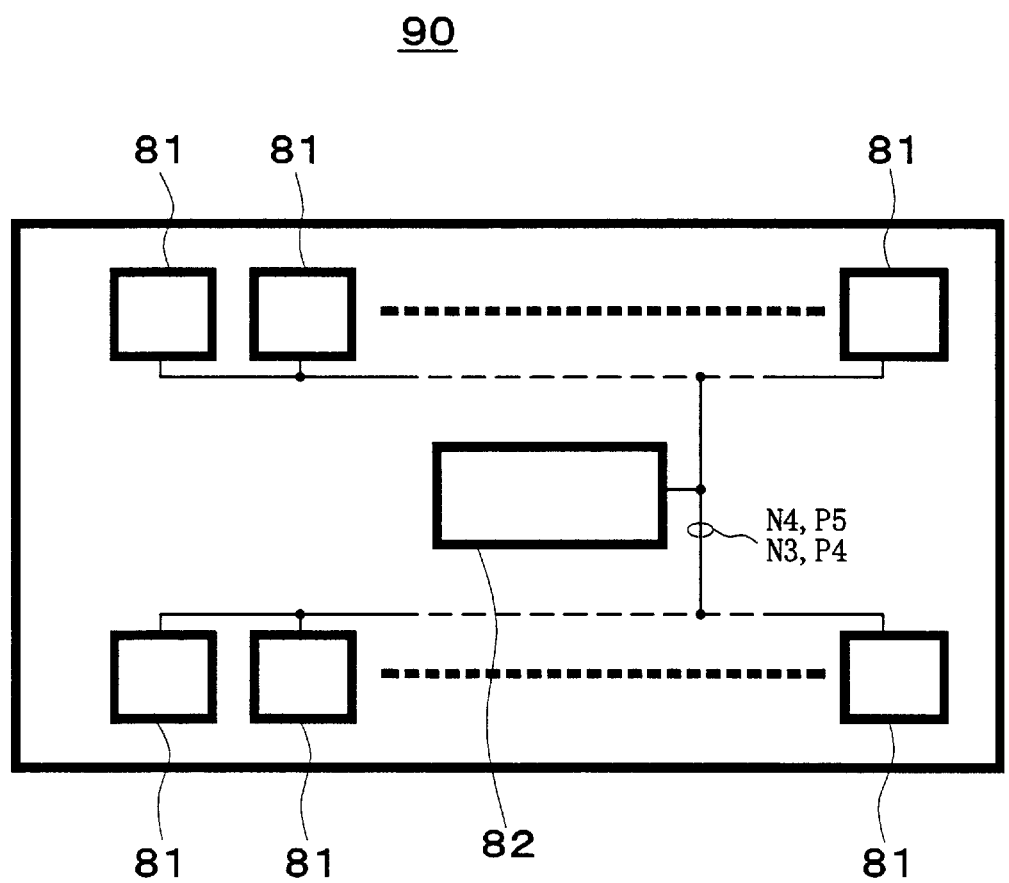
FIG. 17 illustrates the chip achieved in a ninth embodiment in a its entirety.
Figure 18:
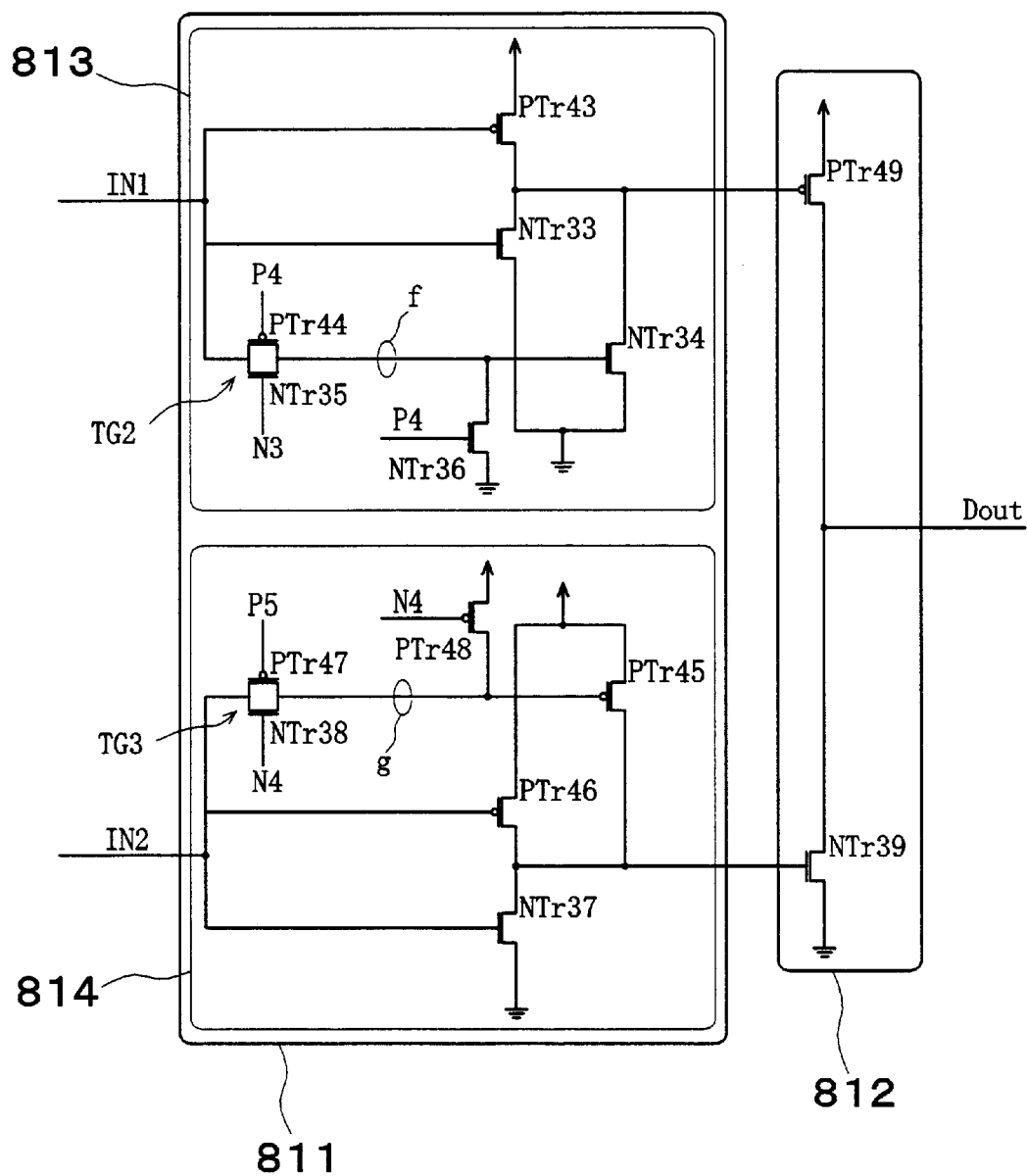
FIG. 18 illustrates an output circuit adopted in a ninth embodiment.
Figure 19:
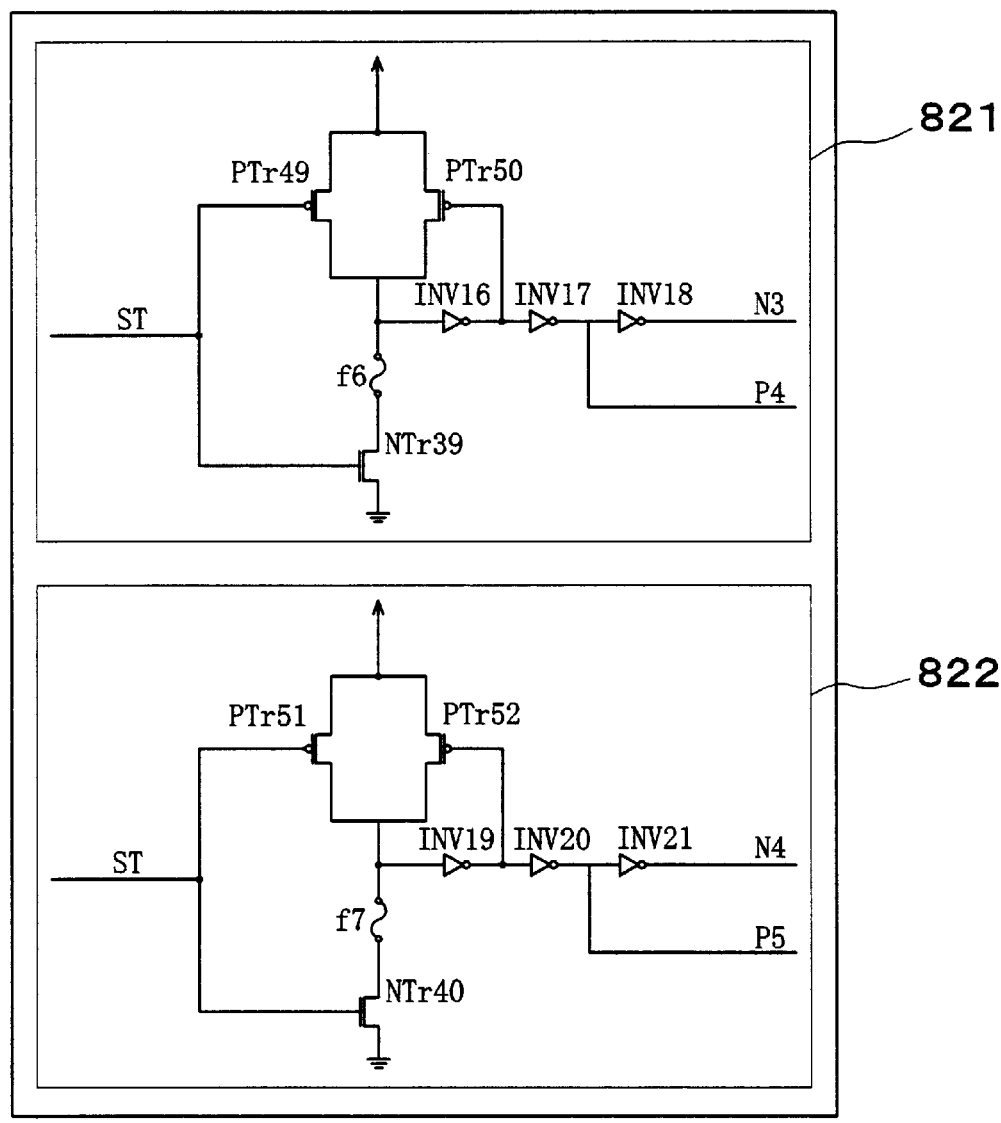
FIG. 19 illustrates a fuse circuit adopted in the ninth embodiment.

A semiconductor memory 90 in the ninth embodiment is explained in reference to FIGS. 17~19. The semiconductor memory 90 comprises a plurality of output circuits 81 and a fuse circuit 82 shared by the individual output circuits 81, as illustrated in FIG. 17.

As shown in FIG. 18, the output circuits 81 are each constituted of a pre-driver circuit unit 811 and an output buffer circuit unit 812. The output buffer circuit unit 812 comprises a PMOS transistor PTr49 for H level output and an NMOS transistor NTr39 for L level output. The pre-driver circuit unit 811 comprises a first pre-driver portion 813 that drives the PMOS transistor PTr49 in the output buffer circuit unit 812 at the following stage and a second predriver portion 814 that drives the NMOS transistor NTr39 in the output buffer circuit unit 812 at the following stage.

The first pre-driver portion 813 is constituted of a PMOS transistor PTr43 and an NMOS transistor NTr33 that are serially connected between the source terminal and the ground terminal, an NMOS transistor NTr34 connected in parallel to the NMOS transistor NTr38, a transfer gate TG2 which is connected between an input IN1 and the NMOS transistor 34 and comprises a PMOS transistor PTr44 and an NMOS transistor NTr35 and an NMOS transistor NTr36 which is connected to the gate (a node "f") of the NMOS transistor NTr34. The gate of the NMOS transistor NTr35 is connected to an output N3 of a first fuse circuit 821 which is to be detailed later. The gate of the NMOS transistor NTr36 and the gate of the PMOS transistor PTr44 are both connected to an output P4 of the first fuse circuit 821 to be detailed later.

Thus, in the first pre-driver portion 813, the transistor that determines its driving capability is formed in a comb shape and part of the comb-shaped transistor is replaced by the MOS transistors PTr43 and NTr33 that are serially connected.

In addition, the transfer gate TG2, which is connected to the gate (the node "f") of the NMOS transistor NTr34, functions as a switch that sets ON/OFF the NMOS transistor NTr34.

The second pre-driver portion 814 is constituted of a PMOS transistor Ptr46 and an NMOS transistor NTr37 that are serially connected between the source terminal and the ground terminal and a PMOS transistor PTr45 connected in parallel to the PMOS transistor PTr46, a transfer gate TG3, which is connected between an input IN2 and the PMOS transistor Ptr45 and comprises a PMOS transistor PTr47 and an NMOS transistor NTr38 and a PMOS transistor PTr48 which is connected to the gate (a node "f") of the PMOS transistor PTr45. The gate of the PMOS transistor PTr47 is connected to an output P5 of a second fuse circuit 822 which is to be detailed later. The gate of the PMOS transistor PTr48 and the gate of the NMOS transistor NTr38 are both connected to an output N4 of the second fuse circuit 822 to be detailed later.

Thus, in the second pre-driver portion 814, the transistor that determines its driving capability is formed in a comb shape and part of the comb-shaped transistor is replaced by the MOS transistors PTr46 and NTr37 that are serially connected.

In addition, the transfer gate TG3, which is connected to the gate (the node "g") of the PMOS transistor PTr45, functions as a switch that sets ON/OFF the PMOS transistor PTr45.

As shown in FIG. 19, the fuse circuit 82 comprises the first fuse circuit 821 that is connected to the gates of the PMOS transistor PTr44, the NMOS transistor NTr35 and the NMOS transistor NTr36 in the first pre-driver portion 813 and the second fuse circuit 822 connected to the gates of the PMOS transistor PTr47, the NMOS transistor NTr38 and the PMOS transistor PTr48 in the second pre-driver driver portion 814.

The first fuse circuit 821 is constituted of a PMOS transistor PTr49, a fuse f6 and an NMOS transistor NTr39 serially connected between the source terminal and the ground terminal, a PMOS transistor PTr50 connected in parallel to the PMOS transistor PTr49 and inverters INV16, INV17 and INV18 serially connected between a node located between the PMOS transistor PTr49 and the fuse f6 and the output N3. The gates of the PMOS transistor PTr49 and the NMOS transistor NTr39 are connected to an input ST. The gate of the PMOS transistor PTr50 is connected to a node located between the inverters INV16 and INV17. A node located between the inverters INV17 and INV18 is connected to the output P4.

The second fuse circuit 822 is constituted of a PMOS transistor PTr51, a fuse f7 and an NMOS transistor NTr40 serially connected between the source terminal and the ground terminal, a PMOS transistor PTr52 connected in parallel to the PMOS transistor PTr51 and inverters INV19, INV20 and INV21 serially connected between a node located between the PMOS transistor PTr51 and the fuse f7 and the output N4. The gates of the PMOS transistor PTr51 and the NMOS transistor NTr40 are connected to the input ST. The gate of the PMOS transistor PTr52 is connected to a node located between the inverters INV19 and INV20. A node located between the inverters INV20 and INV21 is connected to the output P5.

The fuse circuit 82 described above achieves a circuit structure that enables control of the outputs N3, P4, N4 and P5 so that they output either H level or L level in conformance to whether or not the fuses f6 and f7 are disconnected. The following is an explanation of changes occurring in the operation in conformance to the connected disconnected states of the fuses f6 and f7.

First, a state in which neither the fuse f6 or the fuse f7 is disconnected is explained. When the specific length of time has elapsed after a power-up, the input ST of the fuse circuit 82 shifts to H level. In the first fuse circuit 821, with the NMOS transistor NTr39, whose source is connected to the ground terminal entering an ON state, the output P4 shifts to L level via the fuse f6, and the inverters INV16 and INV17 and also the output N4 shutter shifts to H level via the inverter INV18. In the second fuse circuit 822, with the NMOS transistor NTr40, whose source is connected to the ground terminal entering an ON state, the output P5 shifts to L level via the fuse f7 and the inverters INV19 and INV20 and also, the output N4 shifts to H level via the inverter INV21. When the output N3 is at H level, the output P4 is at L level, the output N4 is at H level and the output P5 is at L level, the transfer gates TG2 and TG3 are set to ON and the NMOS transistor NTr36 and the PMOS transistor PTr48 are set to OFF at the output circuit 81. In this case, the NMOS transistor NTr34 and the PMOS transistor PTr45 are set ON/OFF respectively in response to shifts occurring in the inputs IN1 and IN2.

Next, a state in which the fuse f6 is disconnected but the fuse f7 is not disconnected is explained. Until the specific length of time elapses after a power-up, the input ST at the fuse circuit 82 remains at L level. In the first fuse circuit 821, with the PMOS transistor PTr49 whose source is connected to the source terminal entering an ON state, the output P4 shifts to H level via the inverters INV16 and INV17 and also the output N3 shifts to L level via the inverter INV18. In the second fuse circuit 822, the output N4 shifts to H level and the output P5 shifts to L level as described above. When the output N3 is at L level, the output P4 is at H level, the output N4 is at H level and the output P5 is at L level, the transfer gate TG2 is set to OFF, the transfer gate TG3 is set to ON, the NMOS transistor NTr36 is set to ON and the PMOS transistor PTr48 is set to OFF at the output circuit 81. In this case, since the node "f" is at L level at the first pre-driver portion 813, the NMOS transistor NTr34 remains in an OFF state in spite of the shift occurring in the input signal IN1 and, as a result, the capability for driving the PMOS transistor PTr49 of the pre-driver unit 812 at the following stage corresponds to the capability of the NMOS transistor NTr33 alone.

Now, a state in which the fuse f6 is not disconnected but the fuse f7 is disconnected is explained. As explained earlier, the output N3 shifts to H level and the output P4 shifts to L level in the first fuse circuit 821. In addition, until the specific length of time elapses after a power-up, the input ST at the fuse circuit 82 remains at L level. In the second fuse circuit 822, with the PMOS transistor PTr51 whose source is connected to the source terminal entering an ON state, the output P5 shifts to H level via the inverters INV19 and INV20 and also, the output N4 shifts to L level via the inverter INV21. When the output N3 is at H level, the output P4 is at L level, the output N4 is at L level and the output P5 is at H level, the transfer gate TG2 is set to ON, the transfer gate TG3 is set to OFF, the NMOS transistor NTr36 is set to OFF and the PMOS transistor PTr48 is set to ON at the output circuit 82. In this case, since the node "g" is at H level at the second pre-driver portion 814, the PMOS transistor PTr45 remains in an OFF state in spite of the shift occurring in the input signal IN2 and, as a result, the capability for driving the NMOS transistor NTr39 of the pre-driver unit 812 at the following state corresponds to the capability of the PMOS transistor PTr46 alone.

As explained above, in this embodiment, by providing the fuse circuit 82 having the fuses f6 and f7 that can be easily disconnected with a laser beam, the gate widths W of the pre-drivers at the output circuits within the chip can be adjusted all at once. Thus, the length of machining time can be reduced compared to that required in the prior art technology that employs an FIB apparatus to disconnect wiring. In this regard, it achieves an advantage identical to that achieved in the first embodiment.

However, while two transistors are serially connected at the pre-driver unit to be adjusted and, therefore, the layout area increases greatly if the gate width W at the pre-driver unit undergoing adjustment increases in the first embodiment, a layout area which is approximately only half of that accounted for by the pre-driver unit in the first embodiment is required even when the gate width W at the pre-driver unit increases in this embodiment. In addition, since the presence of the CMOS transfer gates does not result in a great increase in the layout area in the embodiment, the overall layout area can be minimized, thereby achieving an advantage of preventing an increase within the chip area.

While the invention has been particularly shown and described with respect to preferred embodiments of the semiconductor memory according to the present invention by referring to the attached drawings, the present invention is not limited to these examples and it will be understood by those skilled in the art that various changes in form and detail may be made therein without departing from the spirit, scope and teaching of the invention.

As explained above, according to the present invention, by providing a fuse circuit having a fuse that can be easily disconnected with a laser beam, the gate widths W of the pre-drivers at the output circuit units, the amplifier circuits, the delay circuits or the input first-stage circuits in a chip can be adjusted all at once. Thus, the length of machining time can be reduced compared to that required in the prior art technology that employs an FIB apparatus to disconnect wiring. In addition, the present invention, which minimizes the layout area is particularly effective in preventing an increase within the chip area.

(tenth Embodiment)

Figure 20:
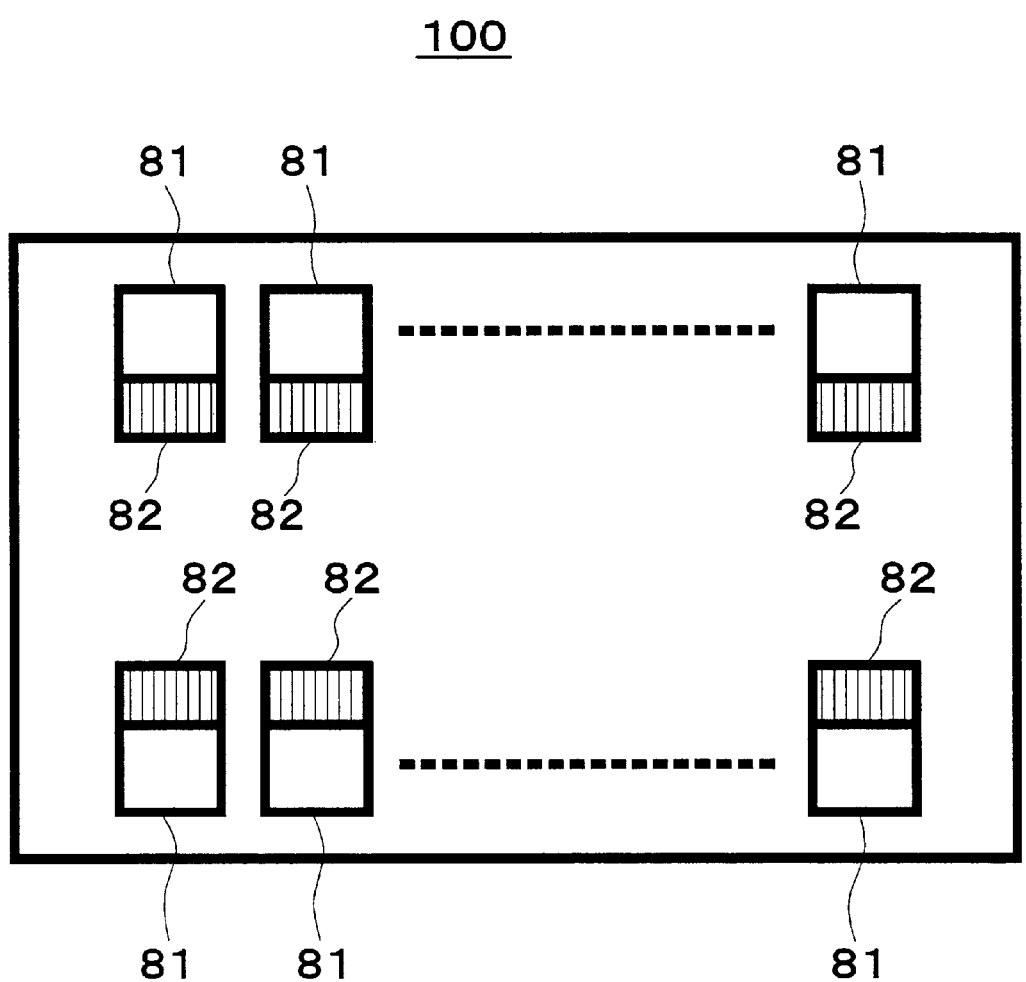
FIG. 20 illustrates the chip achieved in the tenth embodiment in its entirety.

A semiconductor memory 100 in the tenth embodiment is explained in reference to FIG. 20. As shown in FIG. 20, the semiconductor memory 100 comprises a plurality of output circuits 81 and fuse circuits 82 each provided in correspondence to one of the output circuits 81. It is to be noted that since the structural features and the operations achieved in the output circuits 81 and the fuse circuit 82 are identical to those achieved in the ninth embodiment, their explanation is omitted.

As described above, in the embodiment in which the fuse circuit 82 are provided each in correspondence to one of the output circuits 81, the gate width W can be adjusted at each output circuit 81.

What is claimed is:

1. A semiconductor memory, comprising:
   a plurality of output circuits; and
   a fuse circuit commonly connected to said output circuits, wherein;
      said fuse circuit outputs an output signal to said output circuits, the signal level of which is fixed to one signal level or another signal level depending upon whether or not a fuse in said fuse circuit is disconnected; and
      said output circuits each comprise an output buffer circuit unit and a pre-driver circuit unit that drives said output buffer circuit unit, with a driving capability of said pre-driver circuit unit determined by the output signal provided by said fuse circuit.

2. A semiconductor memory according to claim 1, wherein:
   said pre-drive circuit unit achieves a structure in which a transistor that determines said driving capability thereof is formed in a comb shape with part of said comb-shaped transistor replaced by a plurality of serially connected transistors and the output signal from said fuse circuit is partially input to gates of said plurality of serially connected transistors.

3. A semiconductor memory according to claim 1, wherein;
   at said pre-driver circuit unit, a transistor that determines the driving capability thereof is formed in a comb shape and a switch that sets ON/OFF part of said comb-shaped transistor is provided, with the output signal provided by said fuse circuit to change said switch position.

4. A semiconductor memory according to claim 3, wherein:
   said switch is constituted of a transfer gate comprising a first conductive MOS transistor and a second conductive MOS transistor which operates in combination with said first conductive MOS transistor.

5. A semiconductor memory, comprising:
   a plurality of output circuits; and
   a plurality of fuse circuits each connected to one of said output circuits, wherein:
      each of said fuse circuits outputs an output signal to a corresponding output circuit, the signal level of which is fixed to one signal level or another signal level depending upon whether or not a fuse in said fuse circuit is disconnected; and
      said output circuits are each provided with an output buffer circuit unit and a pre-driver circuit unit that drives said output buffer circuit unit, with the driving capability of said pre-driver circuit unit determined by the output signal provided by the corresponding fuse circuit.

6. A semiconductor memory according to claim 5, wherein:
   said pre-drive circuit unit achieves a structure in which a transistor that determines the driving capability thereof is formed in a comb shape with part of said comb-shaped transistor replaced by a plurality of serially connected transistors and the output signal from a said fuse circuit is partially input to gates of said plurality of serially connected transistors.

7. A semiconductor memory according to claim 5, wherein;
   at said pre-driver circuit unit, a transistor that determines the driving capability thereof is formed in a comb shape and a switch that sets ON/OFF part of said comb-shaped transistor is provided, with the output signal provided by said fuse circuit to change said switch position.

8. A semiconductor memory according to claim 7, wherein:
   said switch is constituted of a transfer gate comprising a first conductive MOS transistor and a second conductive MOS transistor which operates in combination with said first conductive MOS transistor.

9. A semiconductor memory, comprising:
   a plurality of amplifier circuits; and
   a fuse circuit commonly connected to said amplifier circuits, wherein;
      said fuse circuit outputs an output signal to each of said amplifier circuits, the signal level of which is fixed to one signal level or another signal level depending upon whether or not a fuse in said fuse circuit is disconnected; and
      the amplifying capability of each of said amplifier circuits is determined by the output signal provided by said fuse circuit.

10. A semiconductor memory according to claim 9, wherein:
    each of said amplifier circuits achieves a structure in which a transistor that determines the amplifying capability thereof is formed in a comb shape with part of said comb-shaped transistor replaced by a plurality of serially connected transistors, and the output signal from said fuse circuit is partially input to gates of said plurality of serially connected transistors.

11. A semiconductor memory, comprising:
    a plurality of amplifier circuits and a plurality of fuse circuits each connected to one of said amplifier circuits, wherein;
       each of said fuse circuits outputs an output signal to a corresponding amplifier circuit, the signal level of which is fixed to one signal level or another signal level depending upon whether or not a fuse in said fuse circuit is disconnected; and
       the amplifying capability of each of said amplifier circuits is determined by the output signal provided by said fuse circuit.

12. A semiconductor memory according to claim 11, wherein:

each of said amplifier circuits achieves a structure in which a transistor that determines the amplifying capability thereof is formed in a comb shape with part of said comb-shaped transistor replaced by a plurality of serially connected transistors and the output signal from said fuse circuit is partially input to gates of said plurality of serially connected transistors.

13. A semiconductor memory, comprising:

a plurality of delay circuits; and a fuse circuit commonly connected to said delay circuits, wherein;

said fuse circuit outputs an output signal, to each of said delay circuits, the signal level of which is fixed to one signal level or another signal level depending upon whether or not a fuse in said fuse circuit is disconnected; and the delay time generated by each of said delay circuits is determined by the output signal provided by said fuse circuit.

14. A semiconductor memory according to claim 13, wherein;

said delay circuits are each provided with an inverter chain constituted by serially connecting a plurality of inverters and a switch located in said inverter chain, and said switch is switched by the output signal provided by said fuse circuit.

15. A semiconductor memory according to claim 14, wherein:

said switch is constituted of a transfer gate comprising a first conductive MOS transistor and a second conductive MOS transistor which operates in combination with said first conductive MOS transistor.

16. A semiconductor memory, comprising:

a plurality of delay circuits; and a plurality of fuse circuits, each connected to one of said delay circuits, wherein:

each of said fuse circuits outputs an output signal to the corresponding delay circuit, the signal level of which is fixed to one signal level or another signal level depending upon whether or not a fuse in said fuse circuit is disconnected; and the delay time generated by each of said delay circuits is determined by the output signal provided by said fuse circuit.

17. A semiconductor memory according to claim 16, wherein;

said delay circuits are each provided with an inverter chain constituted by serially connecting a plurality of inverters and a transistor located in said inverter chain, and the output signal provided by said fuse circuit is input to the gate of said transistor.

18. A semiconductor memory according to claim 17, wherein:

said transistor is constituted of a transfer gate comprising a first conductive MOS transistor and a second conductive MOS transistor which operates in combination with said first conductive MOS transistor.

19. A semiconductor memory, comprising:

a plurality of input first-stage circuits; and a fuse circuit commonly connected to said input first-stage circuits, wherein;

said fuse circuit outputs an output signal to the input first-stage circuits, the signal level of which is fixed to one signal level or another signal level depending upon whether or not a fuse in said fuse circuit is disconnected; and the input voltage margin of each of said input first-stage circuits is determined by the output signal provided by said fuse circuit.

20. A semiconductor memory according to claim 19, wherein:

each of said input first-stage circuits achieves a structure in which a transistor that determines the input voltage margin thereof is formed in a comb shape and part of said comb-shaped transistor is replaced by a plurality of serially connected transistors and the output signal from said fuse circuit is partially input to gates of said plurality of serially connected transistors.

21. A semiconductor memory, comprising:

a plurality of input first-stage circuits; and a plurality of fuse circuits each connected to one of said input first-stage circuits, wherein:

each of said fuse circuits outputs an output signal to a corresponding input first-stage circuit, the signal level of which is fixed to one signal level or another signal level depending upon whether or not a fuse in said fuse circuit is disconnected; and the input voltage margin of each of said input first-stage circuits is determined by the output signal provided by said fuse circuit.

22. A semiconductor memory according to claim 21, wherein:

each of said input first-stage circuits achieves a structure in which a transistor that determines the input voltage margin thereof is formed in a comb shape and part of said comb-shaped transistor is replaced by a plurality of serially connected transistors and the output signal from said fuse circuit is partially input to gates of said plurality of serially connected transistors.

* * * * *